(12) United States Patent
Yamamoto

(10) Patent No.: US 12,183,541 B2
(45) Date of Patent: Dec. 31, 2024

(54) CHARGED PARTICLE BEAM SYSTEM AND OVERLAY MISALIGNMENT MEASUREMENT METHOD

(71) Applicant: Hitachi High-Tech Corporation, Tokyo (JP)

(72) Inventor: Takuma Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 382 days.

(21) Appl. No.: 17/634,501

(22) PCT Filed: Aug. 28, 2019

(86) PCT No.: PCT/JP2019/033751
§ 371 (c)(1),
(2) Date: Feb. 10, 2022

(87) PCT Pub. No.: WO2021/038764
PCT Pub. Date: Mar. 4, 2021

(65) Prior Publication Data
US 2022/0301815 A1  Sep. 22, 2022

(51) Int. Cl.
*H01J 37/22* (2006.01)
*G03F 7/00* (2006.01)
(Continued)

(52) U.S. Cl.
CPC .......... *H01J 37/28* (2013.01); *G03F 7/70633* (2013.01); *H01J 37/222* (2013.01);
(Continued)

(58) Field of Classification Search
None
See application file for complete search history.

(56) References Cited

U.S. PATENT DOCUMENTS

2005/0045821 A1  3/2005  Noji et al.
2011/0139982 A1  6/2011  Kijima et al.
(Continued)

FOREIGN PATENT DOCUMENTS

CN  1820346 A  8/2006
JP  2010-85138 A  4/2010
(Continued)

OTHER PUBLICATIONS

Korean-language Office Action issued in Korean Application No. 10-2022-7004525 dated Jan. 12, 2024 with English translation (11 pages).

(Continued)

*Primary Examiner* — Eliza W Osenbaugh-Stewart
(74) *Attorney, Agent, or Firm* — Crowell & Moring LLP

(57) ABSTRACT

In the present invention, an overlay misalignment is quickly measured. An image generation unit generates an image on the basis of signals from a detector. A matching processing unit identifies, by means of matching processing with a template image, the position of an overlay measurement pattern in the image generated by the image generation unit. A line profile generation unit generates, by scanning the overlay pattern, a first line profile pertaining to a secondary electron signal and a second line profile pertaining to a backscattered electron signal. An overlay misalignment measurement unit identifies the position of a first pattern in the overlay measurement pattern from the first line profile, identifies the position of a second pattern in the overlay measurement pattern from the second line profile, and measures an overlay misalignment in a sample on the basis of the position of the first pattern and the position of the second pattern.

13 Claims, 16 Drawing Sheets

(51) Int. Cl.
*H01J 37/244* (2006.01)
*H01J 37/26* (2006.01)
*H01J 37/28* (2006.01)

(52) U.S. Cl.
CPC .......... *H01J 37/244* (2013.01); *H01J 37/265* (2013.01); *H01J 2237/24475* (2013.01); *H01J 2237/2448* (2013.01); *H01J 2237/2817* (2013.01)

(56) References Cited

U.S. PATENT DOCUMENTS

| | | |
|---|---|---|
| 2012/0305767 A1 | 12/2012 | Toyoda et al. |
| 2015/0287569 A1 | 10/2015 | Yamamoto et al. |
| 2017/0322021 A1* | 11/2017 | Takagi .................. G06V 10/24 |
| 2017/0323763 A1 | 11/2017 | Itai et al. |

FOREIGN PATENT DOCUMENTS

| | | |
|---|---|---|
| JP | 2011-165479 A | 8/2011 |
| JP | 2014-86393 A | 5/2014 |
| KR | 10-2015-0054973 A | 5/2015 |
| KR | 10-1849962 B1 | 4/2018 |
| TW | 201428232 A | 7/2014 |
| WO | WO 2016/017561 A1 | 2/2016 |

OTHER PUBLICATIONS

International Search Report (PCT/ISA/210) issued in PCT Application No. PCT/JP2019/033751 dated Oct. 29, 2019 with English translation (two (2) pages).
Japanese-language Written Opinion (PCT/ISA/237) issued in PCT Application No. PCT/JP2019/033751 dated Oct. 29, 2019 (four (4) pages).
Taiwanese-language Office Action issued in Taiwanese Application No. 109122217 dated Mar. 8, 2021 (seven (7) pages).

* cited by examiner

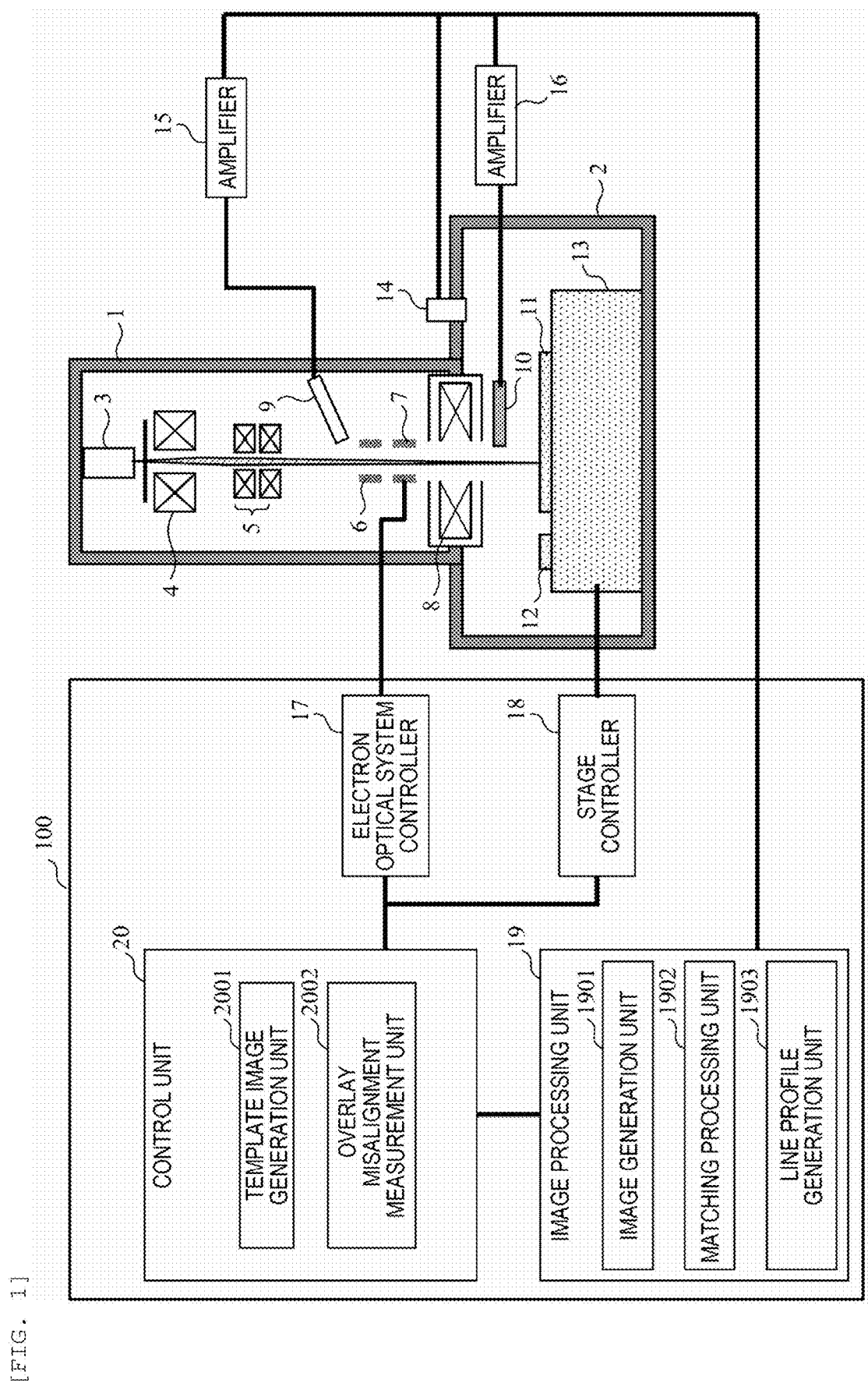
[FIG. 1]

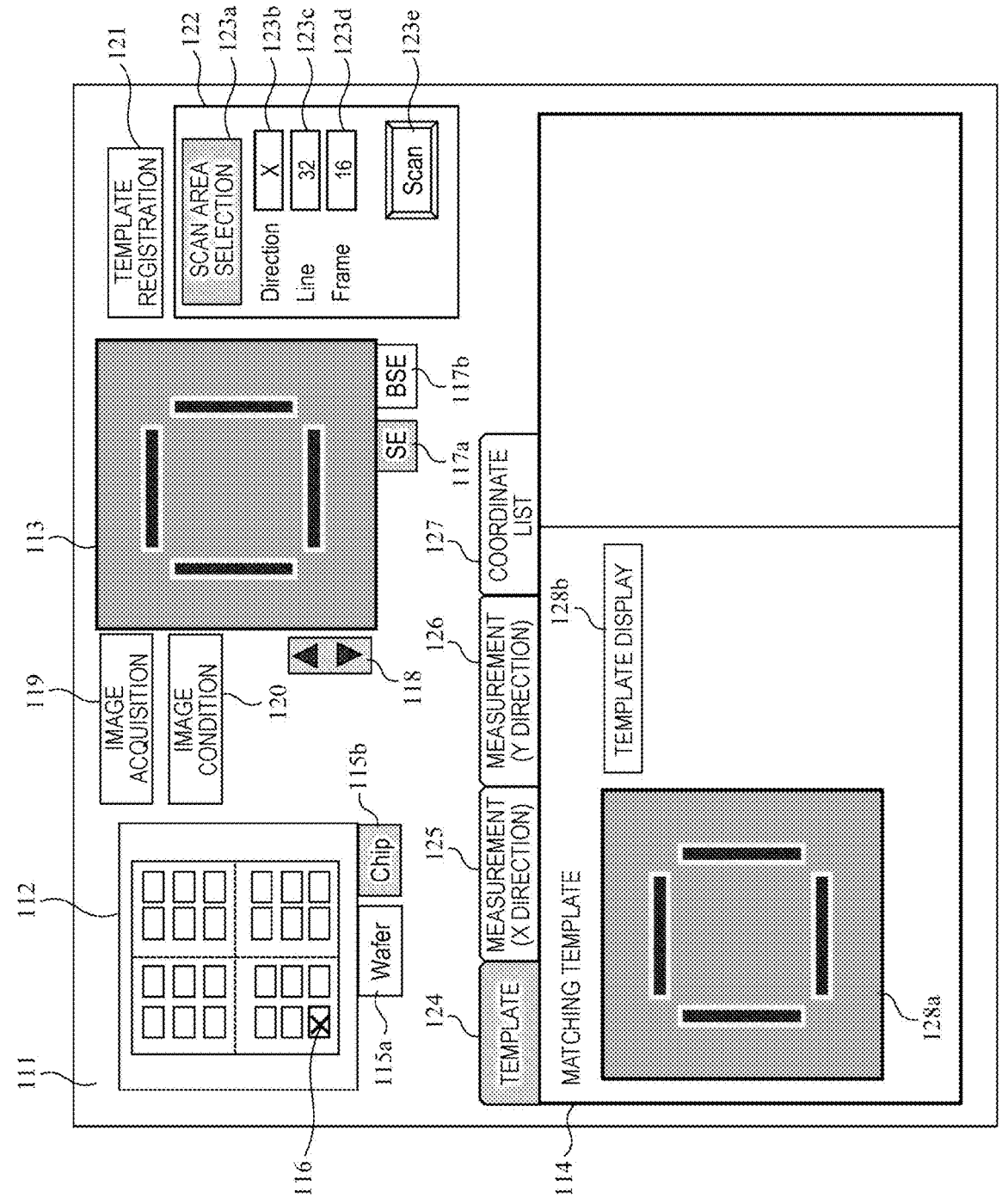
[FIG. 6]

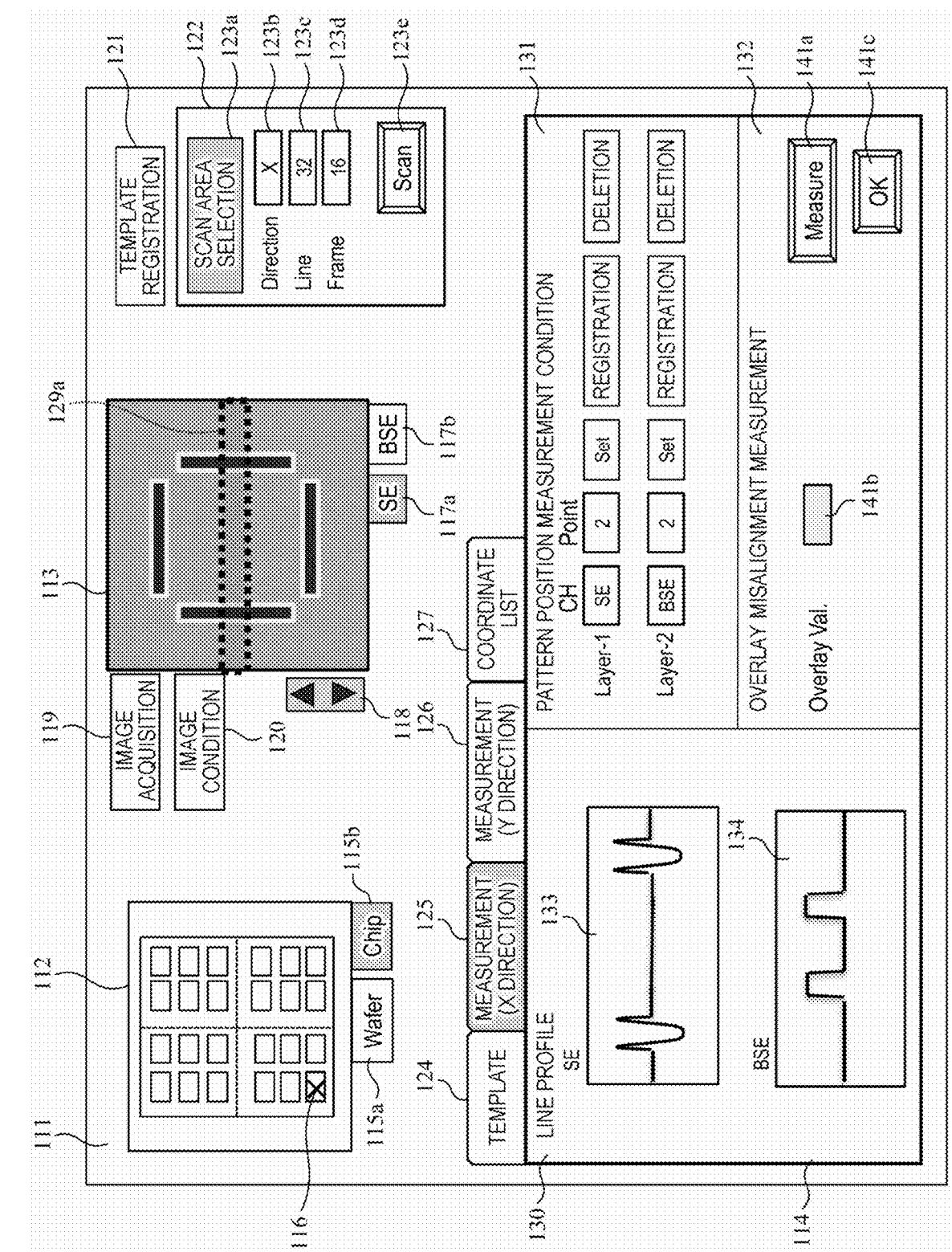

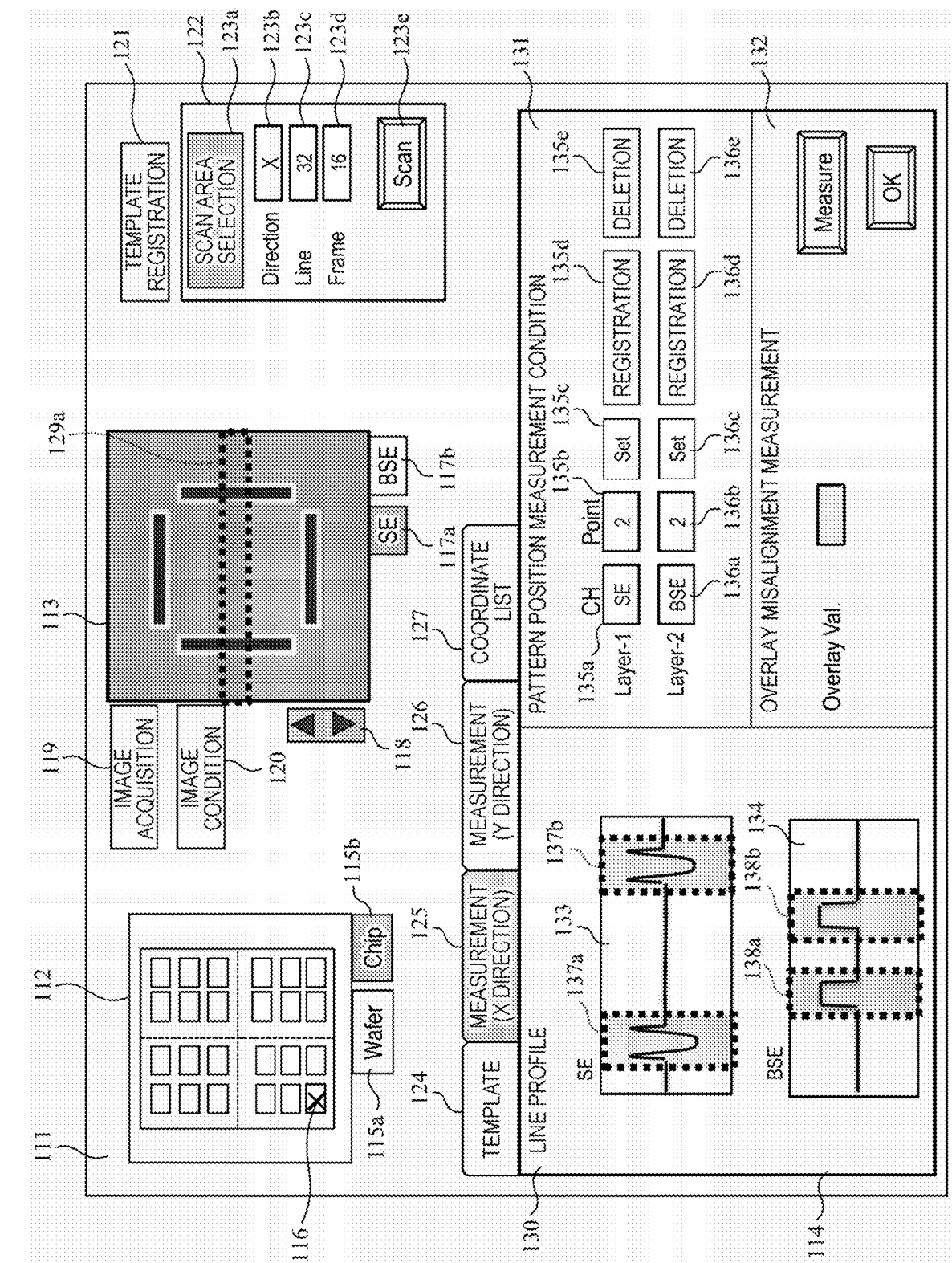
[FIG. 8]

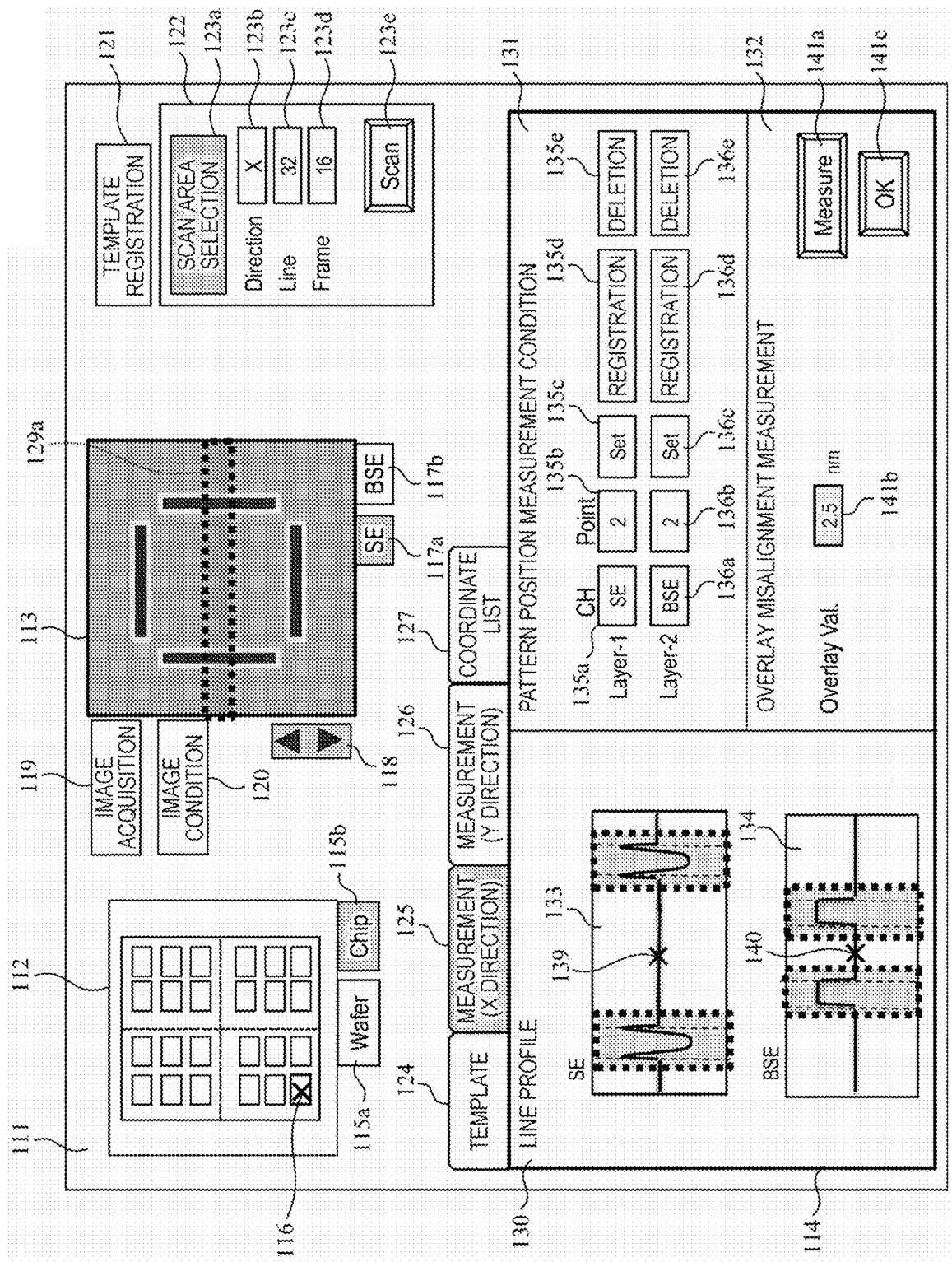

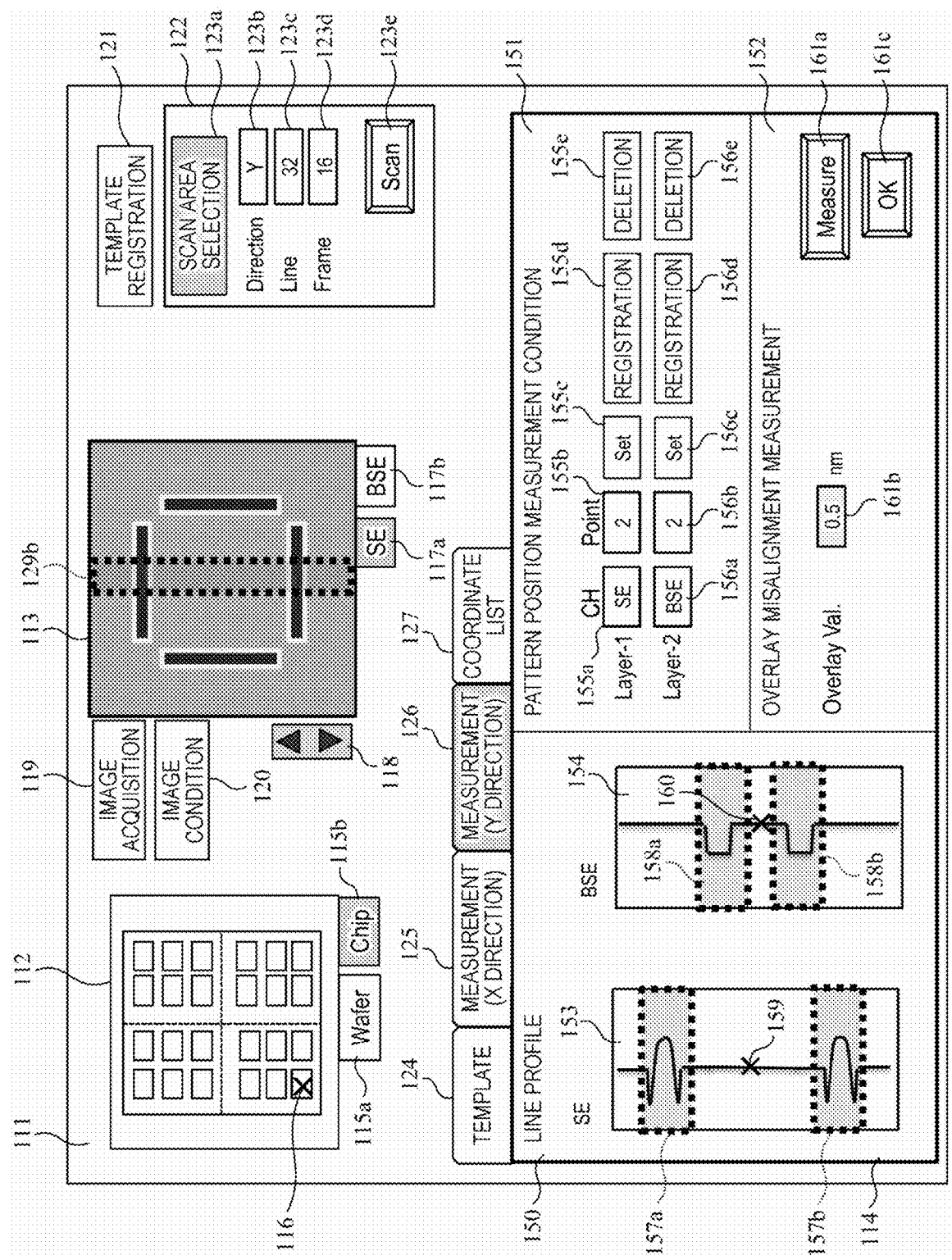
[FIG. 10]

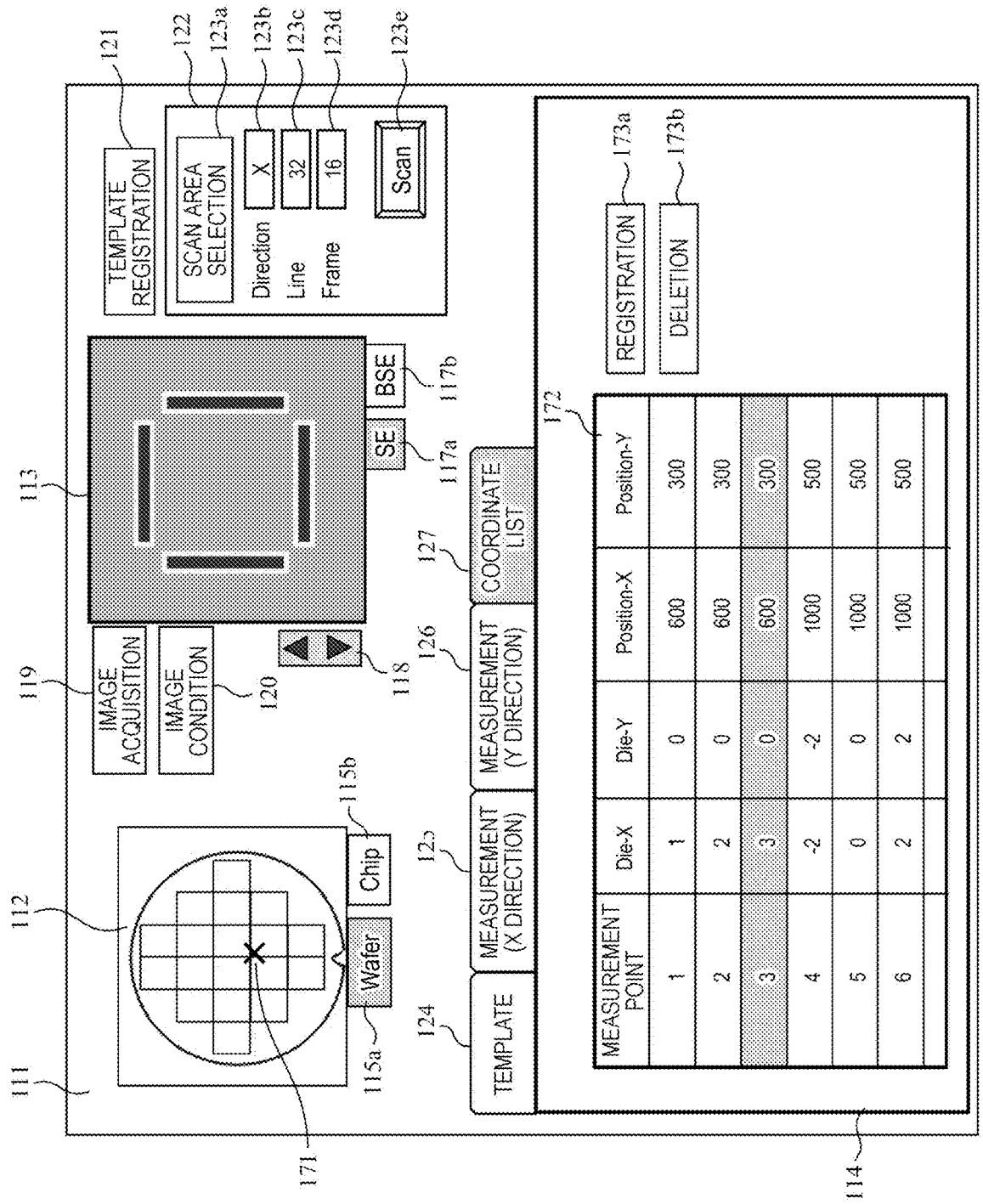
[FIG. 11]

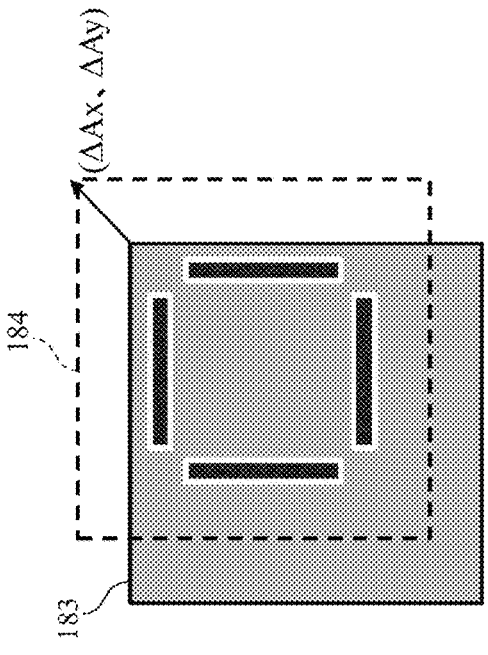
FIG. 12A
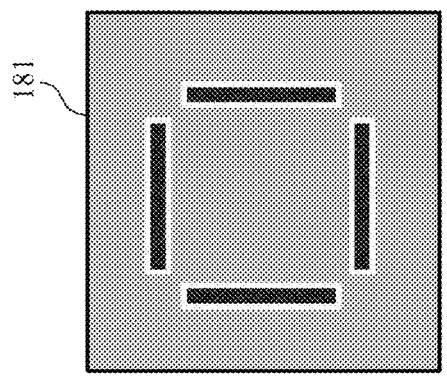
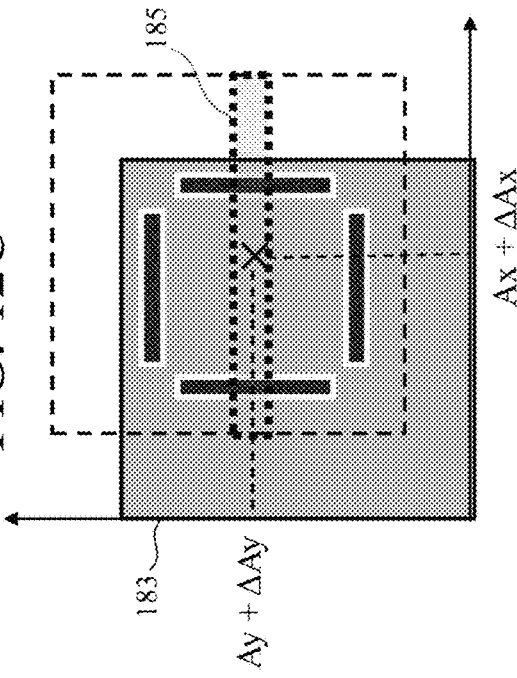
FIG. 12B
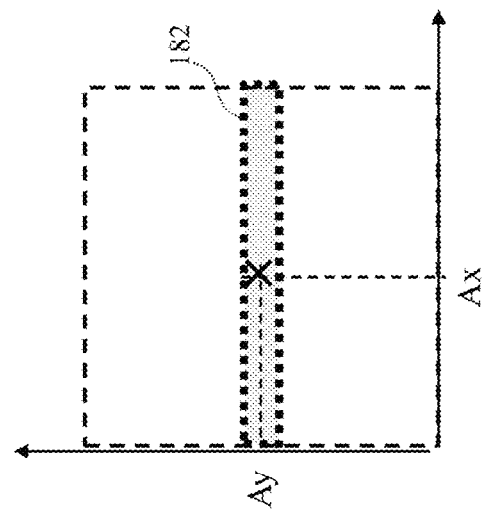
FIG. 12C

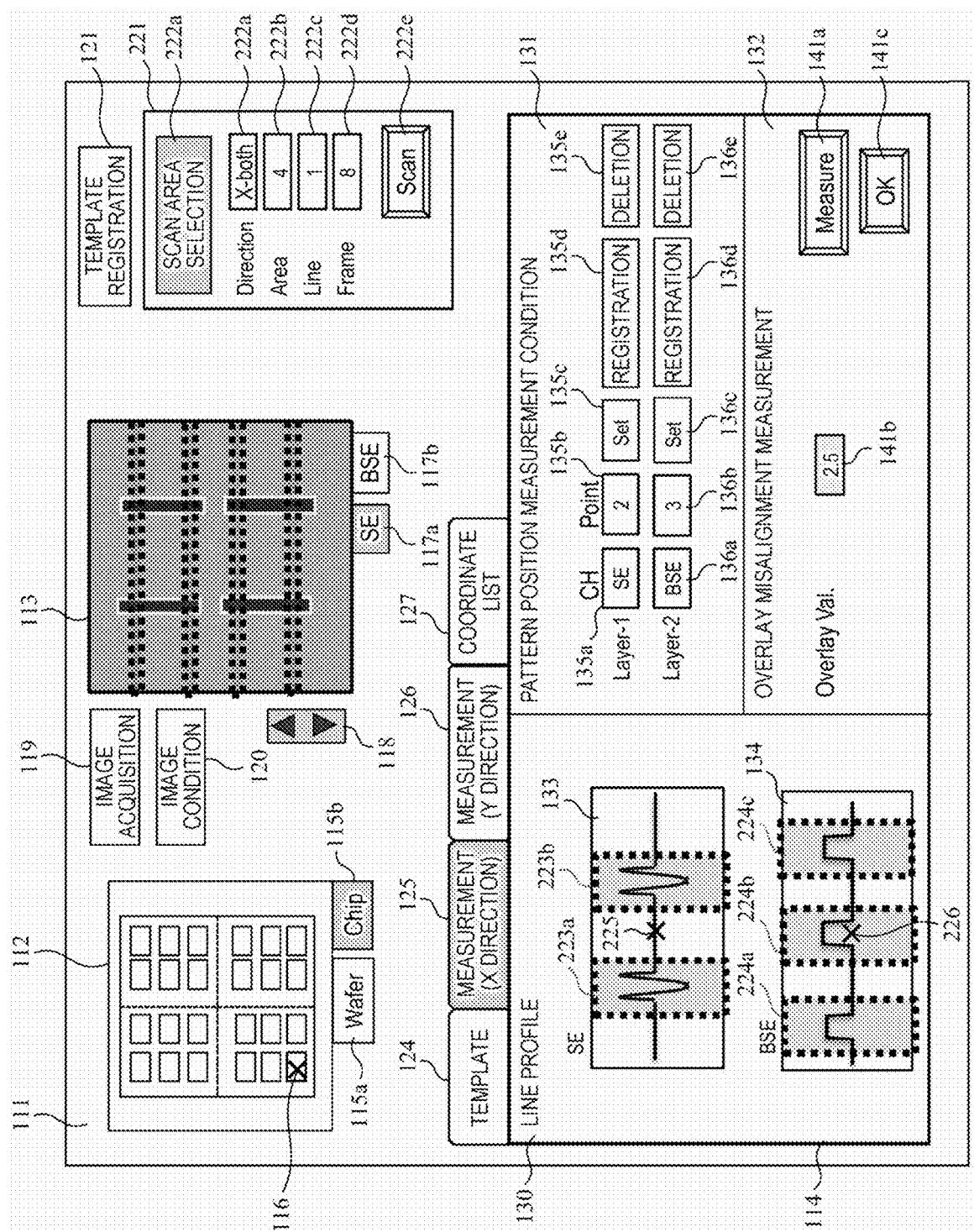
[FIG. 16]

CHARGED PARTICLE BEAM SYSTEM AND OVERLAY MISALIGNMENT MEASUREMENT METHOD

TECHNICAL FIELD

The present invention relates to a charged particle beam system and an overlay misalignment measurement method.

BACKGROUND ART

A semiconductor device is manufactured by performing a step of transferring a pattern formed on a photomask by lithography and etching onto a semiconductor wafer and repeating this step. In the semiconductor device manufacturing process, the quality of the lithography, the quality of the etching, foreign matter generation, and so on significantly affect the yield of the manufactured semiconductor device. Accordingly, it is important to detect the occurrence of an abnormality and a defect in the manufacturing process early or in advance. Accordingly, in the semiconductor device manufacturing process, the pattern formed on the semiconductor wafer is measured and inspected.

Nowadays in particular, it is becoming increasingly important to accurately execute pattern overlay management between different processes as the miniaturization and three-dimensionalization of semiconductor devices are in progress.

In the devices of the related art, the position of a pattern created in each process is measured based on the reflected light that is obtained by irradiating a semiconductor device with light and the amount of pattern overlay misalignment between different processes is measured as a result. However, due to the progress of pattern miniaturization, it is difficult to obtain required detection accuracy by the optical misalignment amount detection method. Accordingly, there is an increasing need to measure the amount of pattern overlay misalignment using a scanning electron microscope higher in resolution than light.

For example, JP-A-2010-85138 (PTL 1) proposes a method for measuring the amount of misalignment between two patterns formed by double patterning with a scanning electron microscope. It should be noted that PTL 1 is to measure the two patterns formed on the surface of a semiconductor device. Accordingly, the scanning electron microscope is capable of easily acquiring images thereof.

In addition, the scanning electron microscope that is disclosed in JP-A-2014-86393 (PTL 2) detects a signal generated from a pattern formed on an intra-irradiation region surface with a secondary electron detector and detects a signal generated from a pattern formed in an intra-irradiation region lower layer with a backscattered electron detector. The amount of overlay misalignment between the surface pattern and the lower layer pattern is measured based on the two signals detected at the same time. In general, secondary electrons contain an amount of sample surface information and backscattered electrons contain an amount of information on the inside of a sub-sample surface lower layer.

In lithography process feedback, it is required to obtain multipoint measurement data and perform correction with an equation of the highest degree possible in order to realize high-accuracy overlay misalignment measurement in a transfer area as a whole. However, multipoint measurement leads to a significant increase in measurement time. The reasons for the increase in measurement time include the image signal of a lower layer pattern being lower in SN ratio than the image signal of an upper layer pattern. Addition frame count needs to be increased in order to obtain an image SN ratio required for high measurement accuracy. The increase in addition frame count leads to an increase in image acquisition time. Then, measurement data needs to be limited in number in actual operation. As a result, a decline in semiconductor device yield arises.

CITATION LIST

Patent Literature

PTL 1: JP-A-2010-85138
PTL 2: JP-A-2014-86393

SUMMARY OF INVENTION

Technical Problem

The present invention has been made in view of the above problems, and an object of the present invention is to provide a charged particle beam system and an overlay misalignment measurement method making it possible to measure the amount of overlay misalignment in a short time and contribute to yield improvement in a miniaturized semiconductor device as a result.

Solution to Problem

In order to solve the above problems, a charged particle beam system according to the present invention includes: a charged particle beam irradiation unit irradiating a sample with a charged particle beam; a detector detecting a secondary electron signal or a backscattered electron signal from the sample; and a computer system controlling the charged particle beam irradiation unit and measuring the amount of overlay misalignment in the sample. The computer system includes an image generation unit generating an image based on a signal of the detector, a matching processing unit specifying a position of an overlay measurement pattern by matching processing in relation to a template image in the image generated by the image generation unit, a line profile generation unit generating a first line profile regarding the secondary electron signal and generating a second line profile regarding the backscattered electron signal by scanning the overlay measurement pattern, and an overlay misalignment measurement unit specifying a position of a first pattern in the overlay measurement pattern from the first line profile, specifying a position of a second pattern in the overlay measurement pattern from the second line profile, and measuring the overlay misalignment in the sample based on the position of the first pattern and the position of the second pattern.

In addition, an overlay misalignment measurement method according to the present invention for measuring the amount of overlay misalignment between different layers of a sample based on a signal detected by a detector by irradiating the sample with a charged particle beam includes: a step of generating an image based on output of the detector; a step of specifying a position of an overlay measurement pattern by matching processing between the image and a template image; a step of generating a first line profile regarding a secondary electron signal and generating a second line profile regarding a backscattered electron signal by scanning the overlay measurement pattern; a step of specifying a position of a first pattern in the overlay measurement pattern from the first line profile and specifying a position of a second pattern in the overlay measurement pattern from the second line profile; and a step of measuring the overlay misalignment in the sample based on the position of the first pattern and the position of the second pattern.

Advantageous Effects of Invention

According to the present invention, it is possible to measure the overlay misalignment at multiple points in a short time and more accurately manage the overlay misalignment in a lithography process using multipoint measurement data. As a result, it is possible to provide a charged particle beam system and an overlay misalignment measurement method making it possible to contribute to yield improvement in a miniaturized semiconductor device.

BRIEF DESCRIPTION OF DRAWINGS

FIG. 1 is a schematic diagram illustrating a schematic configuration of a scanning electron microscope (SEM) as a charged particle beam system according to a first embodiment.

FIG. 6 is a screen display example illustrating a procedure for setting a template image, a scanning area, and a measurement position in a recipe in an apparatus of the first embodiment.

FIG. 7 is a screen display example illustrating the procedure for setting the template image, the scanning area, and the measurement position in the recipe in the apparatus of the first embodiment.

FIG. 8 is a screen display example illustrating the procedure for setting the template image, the scanning area, and the measurement position in the recipe in the apparatus of the first embodiment.

FIG. 9 is a screen display example illustrating the procedure for setting the template image, the scanning area, and the measurement position in the recipe in the apparatus of the first embodiment.

FIG. 10 is a screen display example illustrating the procedure for setting the template image, the scanning area, and the measurement position in the recipe in the apparatus of the first embodiment.

FIG. 11 is a screen display example illustrating the procedure for setting the template image, the scanning area, and the measurement position in the recipe in the apparatus of the first embodiment.

FIGS. 12A to 12C are schematic diagrams illustrating details of a method for scan area position correction in the pattern matching step (Step S45c) and the setting area scan step (Step S45d) in the flowchart of FIG. 3(b).

FIG. 16 is a screen display example of an apparatus of the second embodiment.

DESCRIPTION OF EMBODIMENTS

Figure 2A:
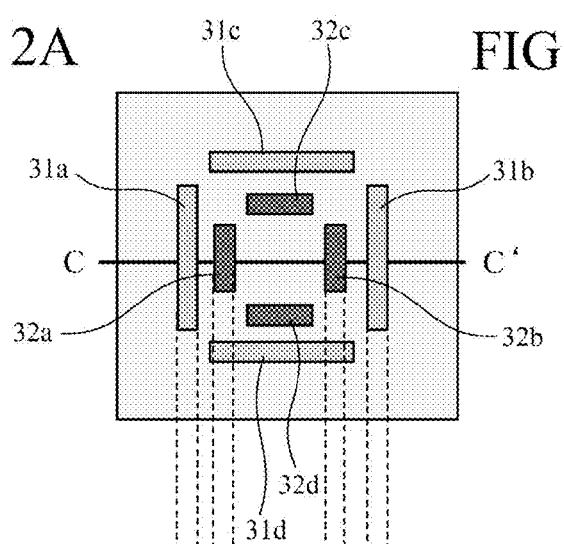
FIGS. 2A to 2D illustrate an example of the structure of an overlay measurement pattern used for overlay misalignment measurement in the first embodiment.

Hereinafter, the present embodiment will be described with reference to the accompanying drawings. In the drawings, functionally identical elements may be denoted by the same number. It should be noted that the accompanying drawings illustrate embodiments and implementation examples in accordance with the principles of the present disclosure and yet these are for the purpose of understanding the present disclosure and are not used for any limited interpretation of the present disclosure. The description of the present specification is merely a typical example and does not limit the claims or application examples of the present disclosure in any sense.

Although the present embodiment will be described in sufficient detail for those skilled in the art to implement the present disclosure, it is necessary to understand that other implementations and forms are also possible and configurations and structures are modifiable and various elements are replaceable without departing from the scope and spirit of the technical idea of the present disclosure.

Accordingly, the following description should not be construed as limited thereto.

First Embodiment

<Overall Configuration>

First, a schematic configuration of a scanning electron microscope (SEM) as a charged particle beam system according to a first embodiment will be described with reference to FIG. 1. This SEM includes a column 1 as an electron optical system and a sample chamber 2.

The column 1 includes an electron gun 3 generating an electron beam (charged particle beam) to be emitted, a condenser lens 4, an aligner 5, an ExB filter 6, a deflector 7, and an objective lens 8 and functions as a charged particle beam irradiation unit. The condenser lens 4 and the objective lens 8 focus the electron beam generated by the electron gun 3 and perform irradiation on a wafer 11 as a sample. The deflector 7 deflects the electron beam in accordance with an applied voltage in order to perform scanning on the wafer 11 with the electron beam. The aligner 5 is configured to generate an electric field for aligning the electron beam with respect to the objective lens 8. The ExB filter 6 is a filter for capturing secondary electrons emitted from the wafer 11 into a secondary electron detector 9.

In addition, the column 1 and the sample chamber 2 are provided with the secondary electron detector 9 (first detector) for detecting the secondary electrons from the wafer 11 (sample) and a backscattered electron detector 10 (second detector) for detecting backscattered electrons from the wafer 11. It should be noted that the wafer 11 is placed on an XY stage 13 installed in the sample chamber 2. In addition to the wafer 11, a standard sample 12 for beam calibration can be placed on the XY stage 13. In addition, an optical microscope 14 for optically observing the wafer 11 is provided above the XY stage 13 for the wafer 11 to be aligned.

This SEM further includes amplifiers 15 and 16, an electron optical system controller 17, a stage controller 18, an image processing unit 19, and a control unit 20. The electron optical system controller 17, the stage controller 18, the image processing unit 19, and the control unit 20 are included in a computer system 100. The computer system 100 executes various types of measurement (including overlay misalignment measurement) in accordance with signals obtained from various detectors of the SEM and controls the column 1 and the XY stage 13. The amplifiers 15 and 16 amplify detection signals from the secondary electron detector 9 and the backscattered electron detector 10 and output the amplified signals toward the image processing unit 19. The electron optical system controller 17 as a part of the computer system 100 controls the aligner 5, the ExB filter 6, the deflector 7, and so on in the column 1 in accordance with a control signal from the control unit 20.

The stage controller 18 as a part of the computer system 100 outputs a drive signal for driving the XY stage 13 in accordance with the control signal from the control unit 20. The control unit 20 can be configured by, for example, a general-purpose computer.

The image processing unit 19 as a part of the computer system 100 executes image processing for overlay misalignment measurement and sample analysis by processing the signals obtained via the amplifiers 15 and 16. As an example, the image processing unit 19 includes an image generation unit 1901, a matching processing unit 1902, and a line profile generation unit 1903.

The image generation unit 1901 generates an image P1 (first image P1) of the surface of the wafer 11 obtained based on the secondary electrons and an image P2 (second image P2) of a lower layer below the surface obtained based on the backscattered electrons in accordance with the detected and amplified signals obtained from the amplifiers 15 and 16. The image generation unit 1901 may be capable of executing edge extraction processing for edge extraction in the first image P1 and the second image P2 and smoothing processing on the first image P1 and the second image P2 as pre-edge extraction processing.

The matching processing unit 1902 executes matching between the first image P1 and a template image for the first image P1 and extracts a partial image matching the template image. In addition, the matching processing unit 1902 executes matching between the second image P2 and a template image for the second image P2 and extracts a partial image matching the template image. The matching processing unit 1902 specifies the position of an overlay measurement pattern (described later) based on the partial image. The template image is, for example, a template image regarding the overlay measurement pattern (described later), and the overlay measurement pattern formed on the wafer 11 is specified by the matching processing unit 1902.

The line profile generation unit 1903 scans the overlay measurement pattern specified by the matching processing unit 1902. As a result, the line profile generation unit 1903 generates a line profile based on the detected and amplified signals of the amplifiers 15 and 16 from the secondary electron detector 9 and the backscattered electron detector 10. The line profile may include a line profile based on a secondary electron signal and a line profile based on a backscattered electron signal.

The control unit 20 as a part of the computer system 100 controls the entire scanning electron microscope (SEM) via the electron optical system controller 17 and the stage controller 18. The control unit 20 is capable of including an input unit (not illustrated) such as a mouse and a keyboard for instruction input by a user, a display unit (not illustrated) displaying a captured image or the like, and a storage unit (not illustrated) such as a hard disk and a memory.

In addition, the control unit 20 is capable of including, for example, a template image generation unit 2001 generating the template image and an overlay misalignment measurement unit 2002 for overlay misalignment measurement. The apparatus illustrated in FIG. 1 may include a control unit for each component (not illustrated) and an inter-component information line (not illustrated) in addition to the above.

<Sample Structure>

FIG. 2 illustrates an example of the structure of the overlay measurement pattern for overlay misalignment measurement. FIG. 2(a) is a view seen from the incident direction of an irradiation electron, and FIG. 2(b) illustrates the C-C' cross section of FIG. 2(a).

The overlay measurement pattern exemplified in FIG. 2 can be formed in a region other than the region where an actual circuit pattern is formed. For example, the overlay measurement pattern exemplified in FIG. 2 can be formed on the scribe line of the wafer 11. As an example, this overlay measurement pattern includes patterns 31a, 31b, 31c, 31d, 32a, 32b, 32c, and 32d as illustrated in FIG. 2.

The patterns 31a to 31d are, for example, patterns formed on the surface (upper layer) of the wafer 11. The patterns 31a and 31b are used for X-direction overlay misalignment measurement, and the patterns 31c and 31d are used for Y-direction overlay misalignment measurement.

The patterns 32a to 32d are patterns formed in the layer (lower layer) in the wafer 11 positioned below the surface (upper layer). The patterns 32a and 32b are used for X-direction overlay misalignment measurement, and the patterns 32c and 32d are used for Y-direction overlay misalignment measurement. It should be noted that the overlay measurement pattern is designed such that the centers of gravity of the patterns 31a and 31b, the patterns 31c and 31d, the patterns 32a and 32b, and the patterns 32c and 32d match without exception in a case where the overlay misalignment is zero. In a case where a transfer position misalignment occurs in a lithography process, misalignment occurs between the upper and lower layers in the overlay measurement pattern as well.

Figure 2C:
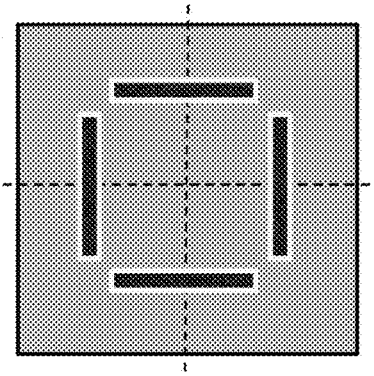
Figure 2B:
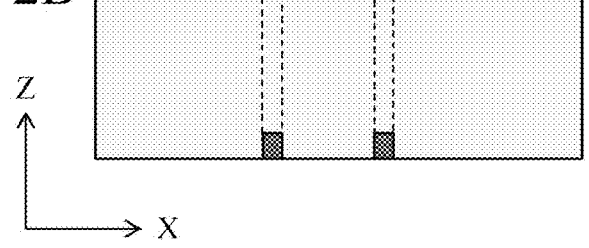
Figure 2D:
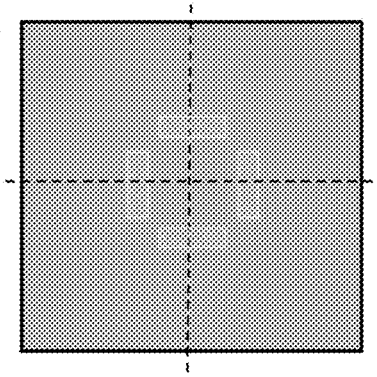

FIG. 2(c) is an example of a secondary electron image (first image P1) by the secondary electron detector 9 and includes the images of the patterns 31a to 31d on the surface (upper layer) of the wafer 11. FIG. 2(d) is an example of a backscattered electron image (second image P2) by the backscattered electron detector 10 and includes the images of the patterns 32a to 32d in the lower layer. The contrast of the image in the second image P2 is lower than the contrast of the image in the first image P1.

<Recipe Execution Sequence>

Figure 3A:
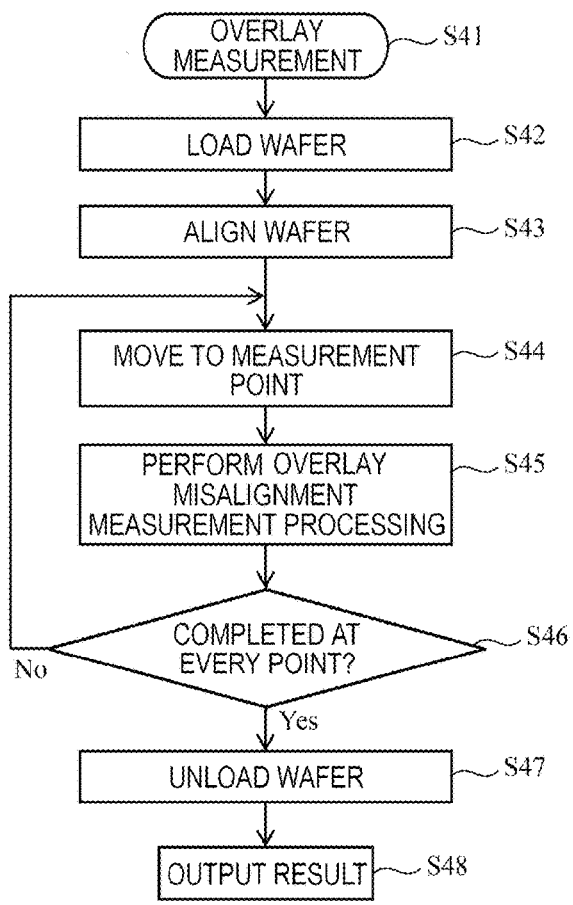
FIGS. 3A and 3B are flowcharts illustrating an example of a procedure for executing inter-layer overlay misalignment measurement in the scanning electron microscope (SEM) of the first embodiment.
Figure 3B:
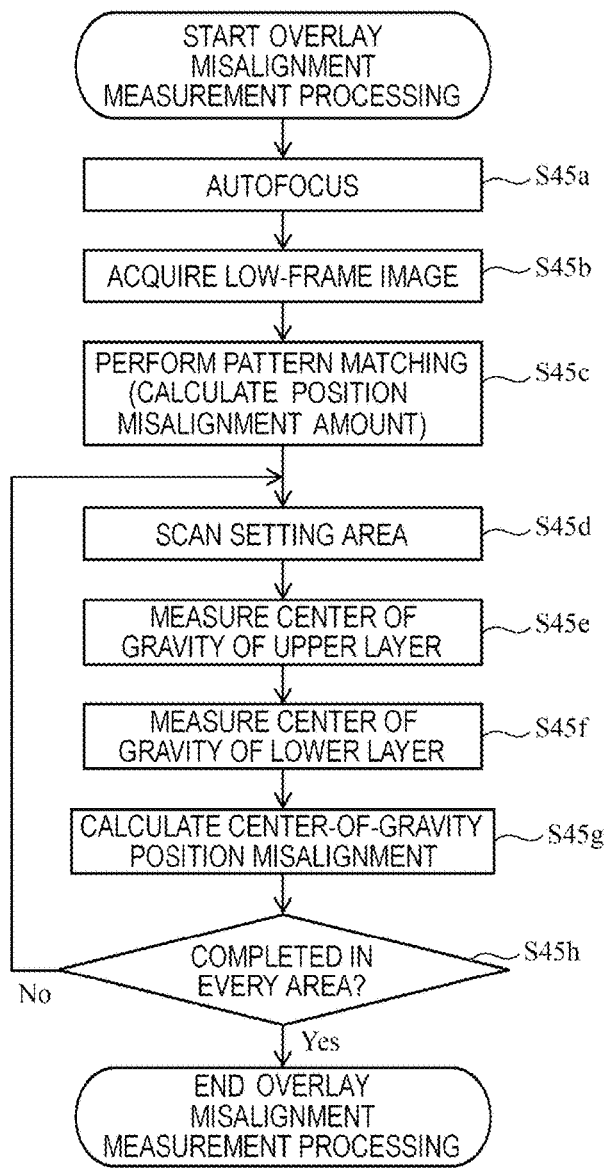

An example of the procedure of inter-layer overlay misalignment measurement execution in the scanning electron microscope (SEM) of the first embodiment will be described with reference to the flowchart of FIG. 3. FIG. 3(a) is a flowchart illustrating the entire flow of the processing procedure executed when the overlay misalignment is calculated. FIG. 3(b) is a flowchart illustrating the procedure of Step S45 in FIG. 3(a) in detail. As illustrated in FIG. 3(b), Step S45 includes Steps S45a to S45h.

First, the entire procedure of overlay misalignment measurement will be described with reference to FIG. 3(a). First, the control unit 20 receives the selection of the wafer 11 to be measured, the selection of a recipe to be applied, and the selection of whether overlay misalignment measurement execution is necessary from the input unit (not illustrated) and a GUI screen displayed on the display unit (not illustrated) and starts overlay measurement (Step S41). It should be noted that the recipe is a collection of settings for automatically and semi-automatically performing a series of measurement sequences.

The control unit 20 loads the selected wafer 11 into the sample chamber 2 by controlling the stage controller 18 and so on (Step S42) and aligns the wafer 11 based on optical microscope and SEM images (Step S43).

Subsequently, the control unit 20 controls the XY stage 13 to move the wafer 11 to a measurement point registered in the recipe (Step S44) and executes overlay misalignment measurement processing based on the captured overlay measurement pattern (Step S45). In a case where the measurement of the overlay misalignment is completed regarding every measurement point registered in the recipe (YES in Step S46), the control unit 20 unloads the wafer 11 from the sample chamber 2 (Step S47) and outputs the result of the measurement of the overlay misalignment to the display unit (not illustrated) and so on (Step S48).

The procedure of the overlay misalignment measurement processing (Step S45) of FIG. 3(a) will be described in detail with reference to FIG. 3(b). When the wafer 11 is moved to a measurement point registered in the recipe, the control unit 20 controls the electron optical system controller 17 and so on to execute SEM image autofocusing (Step S45a).

When a low-frame SEM image is subsequently acquired (Step S45b), the matching processing unit 1902 executes pattern matching between a template image stored in association with the recipe and the SEM image. The position of the overlay measurement pattern in the SEM image is specified in accordance with the result of this matching processing and the amount of misalignment of the position from the position on the recipe is calculated (Step S45c).

After the calculation of the misalignment amount, the control unit 20 controls the electron optical system controller 17 and so on, scans the area set in the recipe after performing position correction based on the misalignment amount, and acquires a secondary electron signal and a backscattered electron signal from the secondary electron detector 9 and the backscattered electron detector 10 (Step S45d).

The line profile generation unit 1903 of the image processing unit 19 creates a line profile of the upper layer patterns (31a to 31d) from the acquired secondary electron signal. Subsequently, the overlay misalignment measurement unit 2002 of the control unit 20 measures the center-of-gravity position from the created line profile (Step S45e). In addition, the center-of-gravity position of the lower layer patterns (32a to 32d) is measured from the backscattered electron signal acquired at the same time (Step S45f). Then, the amount of misalignment between the center-of-gravity position of the upper layer patterns 31a to 31d and the center-of-gravity position of the lower layer patterns 32a to 32d is calculated from the result of the measurement in Steps S45e and S45f (Step S45g). It is determined whether the processing of this procedure is completed in every area set as a measurement point (Step S45h). If there is an unprocessed area, a series of steps for calculating the misalignment of the center-of-gravity position (Steps S45d to S45g) are repeated. The misalignment measurement processing ends if the processing is completed in every area (Yes in Step S45h).

<Center-of-Gravity Misalignment Calculation Sequence>

Hereinafter, a procedure in which the center-of-gravity positions of the patterns 31a to 31d and the patterns 32a to 32d in the X direction and the Y direction in the upper layer and the lower layer are calculated and the overlay misalignment is calculated will be described in detail with reference to FIGS. 4 and 5. As will be described later with reference to FIGS. 4 and 5, in this example, the line profile generation unit 1903 generates a line profile and the center-of-gravity position of the pattern is calculated by the overlay measurement pattern being scanned along a scanning area 51 where the longitudinal direction is the X direction and a scanning area 53 where the longitudinal direction is the Y direction intersecting with the X direction.

Figure 4A:
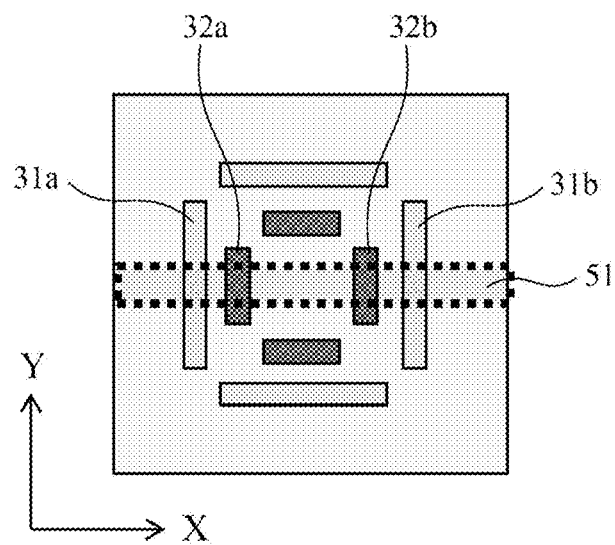
FIGS. 4A to 4D are schematic diagrams illustrating a procedure for calculating the X-direction center-of-gravity position of the overlay measurement pattern in the overlay misalignment measurement.
Figure 4B:
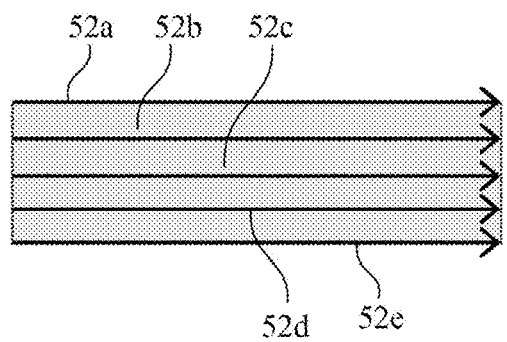

First, the procedure of calculating the center-of-gravity position in the X direction will be described with reference to FIG. 4. The scanning area 51 illustrated in FIG. 4(a) is an area set in the recipe as an area where scanning with an electron beam is performed so that the misalignment of the positions of the centers of gravity of the upper layer pattern (patterns 31a and 31b (first pattern)) and the lower layer pattern (patterns 32a and 32b (second pattern)) in the X direction is measured. As indicated by arrows (52a to 52e) in FIG. 4(b), in the scanning area 51, the electron beam scanning is performed in the direction of the arrow in the X direction.

Figure 4C:
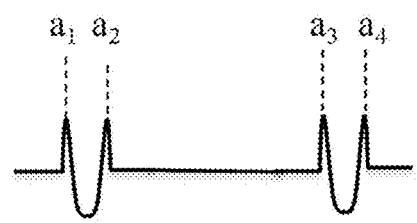

FIG. 4(c) is an example of a line profile (first line profile) obtained by adding a secondary electron signal obtained by scanning along the direction of the arrows (52a to 52e). Detected from this line profile are peak positions $a_1$ and $a_2$ corresponding to the edge of the upper layer pattern 31a and peak positions $a_3$ and $a_4$ corresponding to the edge of the upper layer pattern 31b. Here, respective X-direction center-of-gravity positions $a_{X1}$ and $a_{X2}$ of the patterns 31a and 31b are given by the following equations.

$$a_{X1}=(a_1+a_2)/2 \qquad \text{(Equation 1)}$$

$$a_{X2}=(a_3+a_4)/2 \qquad \text{(Equation 2)}$$

In addition, an X-direction center-of-gravity position $a_X$ of the two patterns 31a and 31b is given by the following equation.

$$a_X=(a_{X1}+a_{X2})/2 \qquad \text{(Equation 3)}$$

Figure 4D:
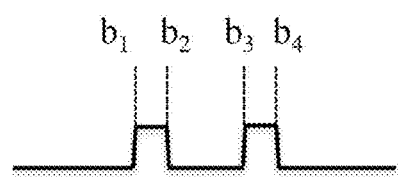

In addition, FIG. 4(d) is an example of a line profile (second line profile) obtained by adding a backscattered electron signal obtained via the backscattered electron detector 10 by scanning along the direction of the arrows (52a to 52e). Detected are edge positions $b_1$ and $b_2$ corresponding to the lower layer pattern 32a and edge positions $b_3$ and $b_4$ corresponding to the lower layer pattern 32b. Here, respective X-direction center-of-gravity positions $b_{X1}$ and $b_{X2}$ of the patterns 32a and 32b are given by the following equations.

$$b_{X1}=(b_1+b_2)/2 \qquad \text{(Equation 4)}$$

$$b_{X2}=(b_3+b_4)/2 \qquad \text{(Equation 5)}$$

In addition, an X-direction center-of-gravity position $b_X$ of the two patterns 32a and 32b is given by the following equation.

$$b_X=(b_{X1}+b_{X2})/2 \qquad \text{(Equation 6)}$$

Here, an X-direction overlay misalignment ΔX is obtained by the following equation.

$$\Delta X = b_X - a_X \quad \text{(Equation 7)}$$

Figure 5A:
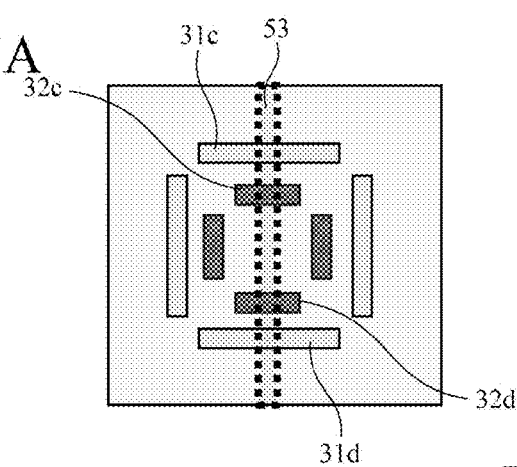
FIGS. 5A to 5D are schematic diagrams illustrating a procedure for calculating the Y-direction center-of-gravity position of the overlay measurement pattern in the overlay misalignment measurement.
Figure 5B:
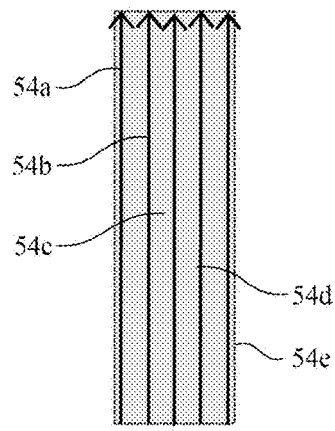

Next, the procedure of calculating the center-of-gravity position in the Y direction will be described with reference to FIG. 5. The scanning area 53 illustrated in FIG. 5(a) is an area set in the recipe as an area where scanning with an electron beam is performed along the Y direction so that the misalignment of the positions of the centers of gravity of the upper layer patterns 31c and 31d and the lower layer patterns 32c and 32d in the Y direction is measured. As indicated by arrows (54a to 54e) in FIG. 5(b), in the scanning area 53, the electron beam scanning is performed along the Y direction.

Figure 5C:
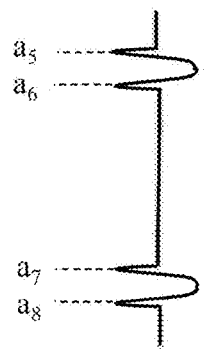

FIG. 5(c) is an example of a line profile obtained by adding a secondary electron signal obtained by scanning along the direction of the arrows (54a to 54e). Detected from this line profile are peak positions $a_5$ and $a_6$ corresponding to the edge of the upper layer pattern 31c and peak positions $a_7$ and $a_8$ corresponding to the edge of the upper layer pattern 31d. Here, respective Y-direction center-of-gravity positions $a_{Y1}$ and $a_{Y2}$ of the patterns 31c and 31d are given by the following equations.

$$a_{Y1} = (a_5 + a_6)/2 \quad \text{(Equation 8)}$$

$$a_{Y2} = (a_7 + a_8)/2 \quad \text{(Equation 9)}$$

In addition, a Y-direction center-of-gravity position $a_Y$ of the two patterns 31c and 31d is given by the following equation.

$$a_Y = (a_{Y1} + a_{Y2})/2 \quad \text{(Equation 10)}$$

Figure 5D:
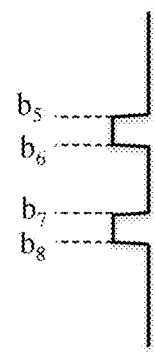

In addition, FIG. 5(d) is an example of a line profile obtained by adding a backscattered electron signal obtained by scanning along the direction of the arrows (54a to 54e). Detected from this line profile are edge positions $b_5$ and $b_6$ corresponding to the lower layer pattern 32c and edge positions $b_7$ and $b_8$ corresponding to the lower layer pattern 32d. Here, respective Y-direction center-of-gravity positions $b_{Y1}$ and $b_{Y2}$ of the patterns 32c and 32d are given by the following equations.

$$b_{Y1} = (b_5 + b_6)/2 \quad \text{(Equation 11)}$$

$$b_{Y2} = (b_{Y1} + b_{Y2})/2 \quad \text{(Equation 12)}$$

In addition, the Y-direction center-of-gravity position $b_X$ of the two patterns 32a and 32b is given by the following equation.

$$b_Y = (b_{Y1} + b_{Y2})/2 \quad \text{(Equation 13)}$$

Here, a Y-direction overlay misalignment ΔY is obtained by the following equation.

$$\Delta Y = b_Y - a_Y \quad \text{(Equation 14)}$$

ΔX and ΔY calculated in the above (Equation 7) and (Equation 14) are output as the result of Step S45.

<Procedure for Template Image/Scanning Area/Measurement Coordinate Registration in Recipe>

Next, a procedure for template image, scanning area, and measurement position setting in the recipe will be described with reference to FIGS. 6 to 11. Illustrated in FIGS. 6 to 11 is an example of the display screen of the display unit in a case where this procedure is executed.

In the event of an instruction for executing the procedure for registering the template image and so on in the recipe, a GUI screen 111 as illustrated in FIG. 6 is displayed on the display unit. The display screen illustrated in FIG. 6 illustrates a post-template image registration display example of the GUI screen 111. As an example, the GUI screen 111 includes a map display area 112, an image display area 113, a recipe condition display area 114, and a scanning area registration unit 122.

The map display area 112 is an area where a wafer map image in which the entire image of the wafer 11 can be grasped or a chip map image in which the structure of a chip configuring a part of the wafer 11 can be grasped can be selectively displayed. The image display area 113 is an area where the captured first image P1 or second image P2 can be selectively displayed. In addition, the recipe condition display area 114 is an area where a template image, a line profile, measurement coordinates, and so on registered as a recipe are displayed. The scanning area registration unit 122 is an operation screen for registering the scanning area 51 or 53 described above.

In the map display area 112, the display of the wafer map image and the chip map image can be switched by clicking a wafer map selection button 115a or a chip map selection button 115b disposed in the lower portion of the map display area 112. FIG. 6 illustrates a state where a chip map is selected and displayed, in which the chip map selection button 115b is highlighted to indicate the selection of the chip map. By clicking a desired position (116) of the chip map image with the chip map image displayed in the map display area 112, the XY stage 13 can be moved to the selected position (116) in the chip map image.

An SEM image is acquired when an image acquisition button 119 is clicked with the XY stage 13 moved to the selected position. In the apparatus of this embodiment, a secondary electron image and a backscattered electron image are acquired at the same time.

The selective display switching of the first image P1 or the second image P2 in the image display area 113 can be performed by clicking a secondary electron image selection button 117a or a backscattered electron image selection button 117b displayed below the image display area 113.

The display magnification of the image in the image display area 113 can be changed by a display magnification change button 118. In addition, other image acquisition conditions can be performed by launching an image condition setting window with an image condition setting button 120. The template image of the secondary electron image (first image P1) can be registered by clicking a template registration button 121 in a state where the first image P1 is displayed in the image display area 113 using the secondary electron image selection button 117a.

The registered template image is displayed in a template display area 128a in a template registration tab 124 of the recipe condition display area 114. The registered template image is displayed in the image display area 113 when a template display button 128b is clicked with the template image registered. FIG. 6 illustrates a state where the template image is displayed in the image display area 113 by clicking the template display button 128b.

Next, a method for registering the scanning areas 51 and 53 will be described with reference to FIGS. 7 to 10. After registration, information on the scanning area 51 and information on the scanning area 53 are stored in a measurement (X direction) tab 125 and a measurement (Y direction) tab 126 of the recipe condition display area 114, respectively.

First, the registration of the scanning area 51 in the X direction will be described with reference to FIGS. 7 to 9. The setting operation of the scanning area 51 is executed with the template image registered and the registered template image displayed in the image display area 113. In the scanning area registration unit 122, the scanning area 51 is registered by inputting scanning conditions of the scanning area 51 (e.g. scanning direction, scanning line count, and addition frame count) via a scanning direction input unit 123b, a scanning line count input unit 123c, and an addition frame count input unit 123d.

With a scanning area selection mode selected using a scanning area selection button 123a, a scanning area 129a is selected by inputting desired data to the input units 123b to 123d in the image display area 113. By clicking a scan button 123e after the selection, the scanning area 129a is scanned with an electron beam in accordance with the set scan conditions. The line profiles of the secondary electron signal and the backscattered electron signal obtained as a result of the scanning are displayed on a secondary electron signal display unit 133 and a backscattered electron signal display unit 134 of a line profile display area 130 in the measurement (X direction) tab 125, respectively (see FIG. 7).

Next, the procedure of measurement position registration in a line profile will be described with reference to FIGS. 8 and 9. In the example of FIG. 8, a secondary electron line profile and a backscattered electron line profile are displayed on the secondary electron signal display unit 133 and the backscattered electron signal display unit 134 of the line profile display area 130 in the measurement (X direction) tab 125.

In this state, a pattern position measurement condition setting area 131 is displayed on the right side of the line profile display area 130. Displayed in the pattern position measurement condition setting area 131 are a CH setting area 135a for setting whether to use a secondary electron signal (SE) or a backscattered electron signal (BSE) in the upper layer (Layer-1) of the wafer 11, a measurement point count setting area 135b for measurement point count setting, a setting button 135c, a registration button 135d, and a deletion button 135e. Also displayed are a CH setting area 136a for setting whether to use a secondary electron signal (SE) or a backscattered electron signal (BSE) in the lower layer (Layer-2) of the wafer 11, a measurement point count setting area 136b for measurement point count setting, a setting button 136c, a registration button 136d, and a deletion button 136e.

In the pattern position measurement condition setting area 131, input to the CH setting area 135a and the measurement point count setting area 135b is performed with regard to the upper layer (Layer-1), and then the setting button 135c is clicked. As a result, measurement cursors 137a and 137b are displayed in the secondary electron signal display unit 133. The widths and positions of the measurement cursors 137a and 137b are adjusted by mouse operation such that the measurement cursor 137a includes the pattern on the left side of the line profile of the secondary electron signal and the measurement cursor 137b includes the pattern on the right side. Subsequently, the registration button 135d is clicked and the measurement area of Layer-1 is confirmed. In some cases, measurement area re-registration is performed after the current registration area is deleted using the deletion button 135e.

Likewise, in the pattern position measurement condition setting area 131, input to the CH setting area 136a and the measurement point count setting area 136b is performed with regard to the lower layer (Layer-2), and then the setting button 136c is clicked. As a result, measurement cursors 138a and 138b are displayed in the backscattered electron signal display unit 134. The widths and positions of the measurement cursors 138a and 138b are adjusted by mouse operation such that the measurement cursor 138a includes the pattern on the left side of the line profile of the backscattered electron signal and the measurement cursor 138b includes the pattern on the right side. Subsequently, the registration button 136d is clicked and the measurement area of Layer-2 is confirmed. In some cases, measurement area re-registration is performed after the current registration area is deleted using the deletion button 136e.

With the line profile acquired and various measurement conditions in the line profile set in this manner, overlay misalignment measurement is executed under the conditions set as described above by clicking a measurement button 141a in an overlay misalignment measurement area 132. In the line profile display area 130 at this time, a center-of-gravity position 139 of the upper layer patterns 31a and 31b and a center-of-gravity position 140 of the lower layer patterns 32a and 32b are displayed together with the line profile. Further, the measured overlay misalignment is displayed in a measurement result display area 141b. If the measurement result is unproblematic, an OK button 141c is clicked to confirm measurement condition.

The registration of the scanning area 53 in the Y direction will be described with reference to FIG. 10. The registration differs from the operation of registering the scanning area 51 in the X direction in that [Y] is input as the input of the scanning direction input unit 123b in the scanning area registration unit 122.

Subsequently, in the procedure of measurement position registration in a line profile, a secondary electron line profile and a backscattered electron line profile are displayed on a secondary electron signal display unit 153 and a backscattered electron signal display unit 154 of a line profile display area 150 in the measurement (Y direction) tab 126. In this state, a pattern position measurement condition setting area 151 is displayed on the right side of the line profile display area 150. In this pattern position measurement condition setting area 151, measurement position registration is executed by operating CH setting areas 155a and 156a, measurement point count setting areas 155b and 156b, setting buttons 155c and 156c, registration buttons 155d and 156d, and deletion buttons 155e and 156e as in the case of the X direction.

With the line profile acquired and various measurement conditions in the line profile set in this manner, overlay misalignment measurement is executed under the conditions set as described above by clicking a measurement button 161a in an overlay misalignment measurement area 152. In the line profile display area 150 at this time, a center-of-gravity position 159 of the upper layer patterns 31c and 31d and a center-of-gravity position 160 of the lower layer patterns 32c and 32d are displayed together with the line profile. Further, the measured overlay misalignment is displayed in a measurement result display area 161b. If the measurement result is unproblematic, an OK button 161c is clicked to confirm measurement condition.

Next, a measurement coordinate registration procedure will be described with reference to FIG. 11. In FIG. 11, a wafer map is displayed in the map display area 112 by clicking the wafer map selection button 115a. Further, in the recipe condition display area 114, a coordinate list tab 127 is displayed and data on coordinates registered as measurement coordinates is displayed on a measurement point list 172.

In this state, the XY stage 13 is driven and moved to a point at which measurement should be performed by clicking a measurement point 171 on the wafer map. With the movement completed, an SEM image is acquired by clicking the image acquisition button 119. The acquired SEM image is displayed in the image display area 113. If the displayed image seems to be misaligned from a desired imaging position, image re-acquisition is performed after clicking a position where the image should be acquired in the image display area 113.

A registration button 173a is clicked with a desired image acquired, and then the coordinates of the image acquisition are added to the measurement point list 172 of the coordinate list tab 127. In the case of correcting information on the registered measurement point, the measurement point that should be changed can be double-clicked on the measurement point list 172, which leads to an editing state where a necessary correction can be made. In the case of measurement point deletion, a deletion button 173b is clicked with a measurement point that should be deleted selected on the measurement point list 172.

Hereinafter, a method for scan area position correction in the pattern matching step (Step S45c) and the setting area scan step (Step S45d) in the flowchart of FIG. 3(b) will be described in detail with reference to FIG. 12.

Here, it is assumed with respect to a template image 181 illustrated in FIG. 12(a) that a scanning area 182 is set about the position of (Ax, Ay) from the lower left of the template image. Further, it is assumed that an area 184 corresponding to the template image 181 is determined at a position shifted by (ΔAx, ΔAy) from an acquired image 183 by pattern matching between the image 183 acquired on the occasion of recipe execution and the template image 181 (FIG. 12(b)). In a case where the overlay measurement pattern in the image 183 is measured in the scanning area 182 as illustrated in FIG. 12(a) in this case, the scanning position may be misaligned from the optimum position and it may be difficult to measure an accurate overlay misalignment. In this regard, in the first embodiment, position correction is performed so as to scan an area 185 about the position of (Ax+ΔAx, Ay+ΔAy) from the lower left in the acquired image 183. As a result, it is possible to scan a desired pattern position (FIG. 12(c)).

Described in the recipe creation in the embodiment described above is an example in which a user manually performs measurement cursor position adjustment on a GUI screen with respect to an acquired line profile. Configuration is performed such that a line template image corresponding to the line profile and a measurement cursor are pre-registered as a recipe, matching processing is executed between the line template image and the acquired line profile, and the position of the measurement cursor set on the line profile is automatically adjusted in accordance with the result of the matching processing.

Figure 13B:
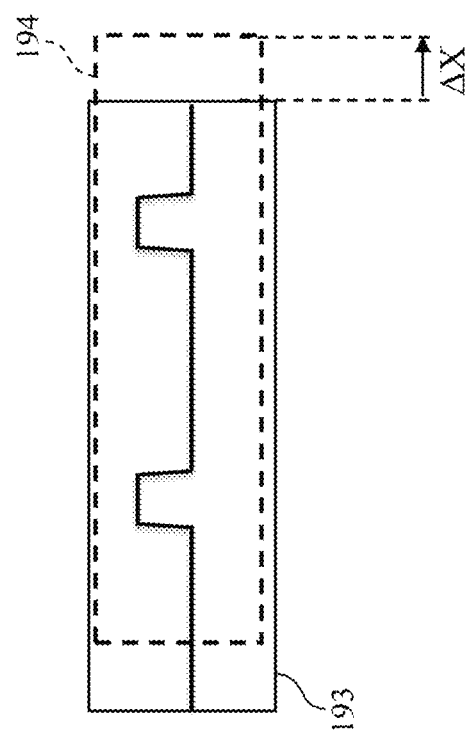
FIGS. 13A to 13C are schematic diagrams illustrating a procedure for automatically correcting the position of a measurement cursor during the measurement of the center-of-gravity position of an upper layer pattern (Step S45e in FIG. 3(b)) and the measurement of the center-of-gravity position of a lower layer pattern (Step S45f).
Figure 13C:
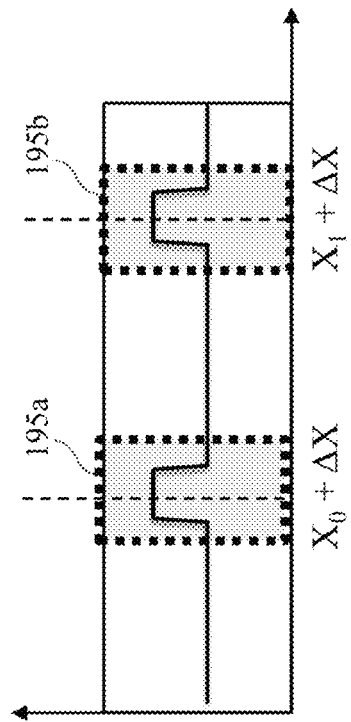
Figure 13A:
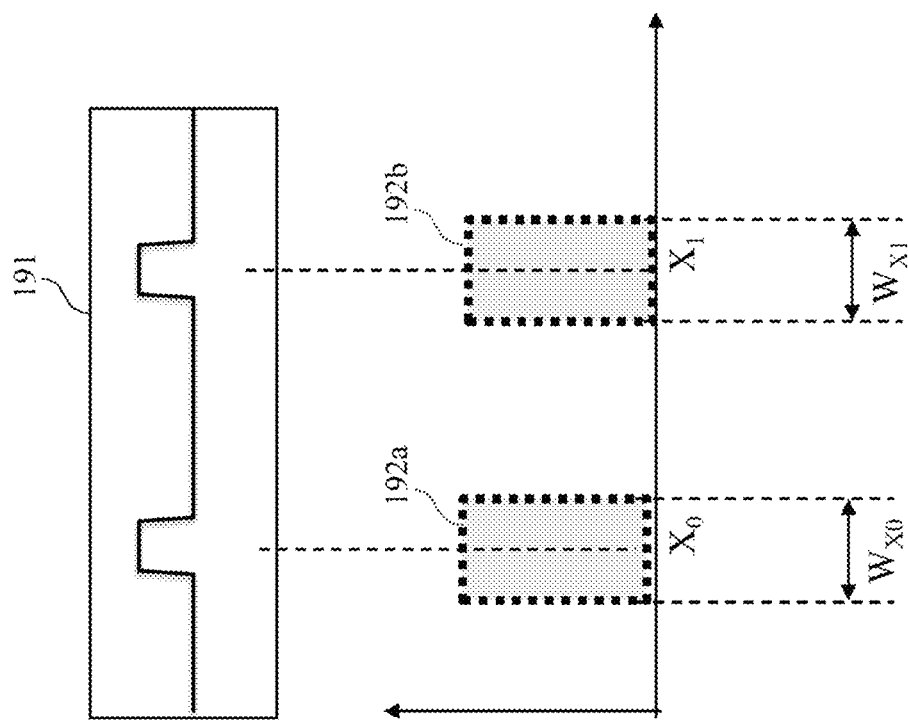

A procedure for automatically performing measurement cursor position correction in the measurement of the center-of-gravity position of the upper layer pattern (Step S45e in FIG. 3(b)) and the measurement of the center-of-gravity position of the lower layer pattern (Step S45f) will be described with reference to FIG. 13.

Two measurement cursors 192a and 192b are set as recipes so as to cover a position corresponding to a pattern with respect to a line template image 191 of a backscattered electron signal. The measurement cursor 192a on the left side is set in the range of a width $W_{X0}$ about the position of a distance X0 from the left end of the line template image 191. Likewise, the measurement cursor 192b on the right side is set in the range of a width $W_{X1}$ about the position of a distance X1 from the left end of the line template image 191.

Pattern matching is performed between the line template image 191 and a line profile 193 of the backscattered electron signal acquired by recipe execution. As a result, an area 194 corresponding to the line template image 191 is determined at a position shifted by the distance ΔX from the acquired line profile 193 (FIG. 13(b)). As illustrated in FIG. 13(c), in the acquired line profile 193 at this time, a measurement cursor 195a on the left side is disposed such that the center is the position of $X_0$+ΔX from the left end. In addition, the right measurement cursor 195b is disposed such that the center is the position of $X_1$+ΔX from the left end. As a result, the two measurement cursors can be disposed so as to match a surface pattern position.

With the scanning electron microscope (SEM) of the first embodiment, when the position of the overlay measurement pattern is specified, electron beam scanning is executed along the scanning area set at that position as described above. As a result, the line profile of the overlay measurement pattern is acquired. The scanning area can be limited to only a part that is necessary for overlay misalignment measurement, and thus the time required for scanning can be reduced. Accordingly, the amount of overlay misalignment can be measured in a short time even in the case of multipoint measurement, and thus a contribution can be made to improving the yield of semiconductor devices advanced in terms of miniaturization. Specifically, area scanning alone takes more than 2 seconds in measuring the amount of overlay misalignment with a 64-frame image added at a TV rate (30 frames per second) and overlay misalignment measurement takes a long time in the case of multipoint measurement. However, according to the present embodiment, scanning time reduction to 0.042 seconds can be achieved in acquiring a line profile from the information of 10 scanning lines of the TV rate. Accordingly, overlay misalignment measurement can be considerably expedited as compared with the related art.

Second Embodiment

Next, a schematic configuration of a scanning electron microscope (SEM) as a charged particle beam system according to a second embodiment will be described with reference to FIGS. 14 to 16. The configuration of the scanning electron microscope of the second embodiment may be substantially identical to that of the first embodiment (FIG. 1). In addition, the amount of overlay misalignment can be measured through a procedure substantially identical to the flowchart of FIG. 3. The difference between the first and second embodiments consists in details of the procedure of overlay measurement pattern measurement.

FIG. 14 illustrates an example of the structure of an overlay measurement pattern used in the second embodiment. FIG. 14(a) is a plan view of the overlay measurement pattern seen from the incident direction of an irradiation electron, and FIG. 14(b) illustrates the D-D' cross section of FIG. 14 (a).

Patterns 201a and 201b and patterns 202a and 202b are formed on the surface (upper layer) of the wafer 11, and patterns 203a, 203b, 203c, 204a, 204b, 204c, 205a, 205b, and 205c are formed in the wafer 11, that is, in a layer (lower layer) below the surface. The center of gravity of the patterns 201a and 201b, the center of gravity of the patterns 202a and 202b, the center of gravity of the patterns 203a, 203b, and 203c, the center of gravity of the patterns 204a, 204b, and 204c, and the center of gravity of the patterns 205a, 205b, and 205c are designed so as to match without exception in a case where the amount of overlay misalignment is zero.

Figure 14A:
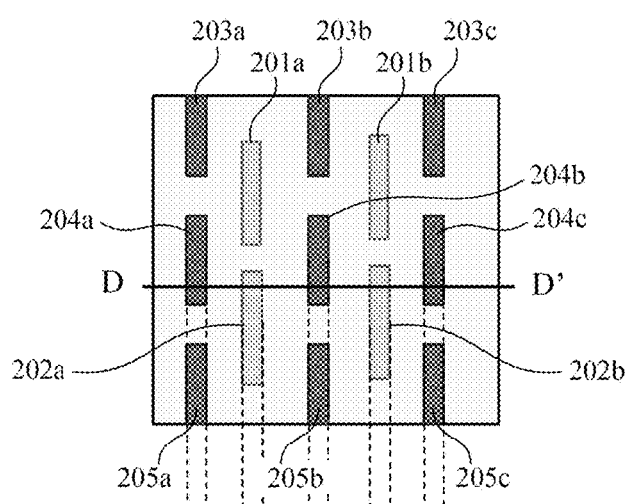
FIGS. 14A to 14D illustrate an example of the structure of an overlay measurement pattern used for overlay misalignment measurement in a second embodiment.
Figure 14C:
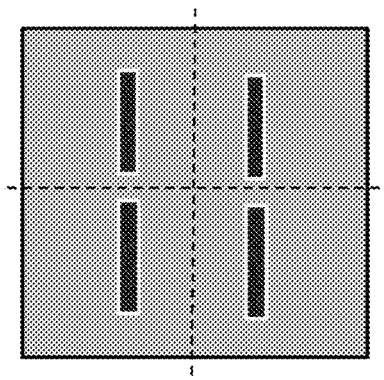
Figure 14B:
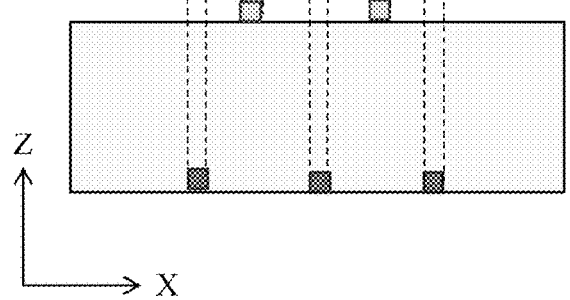
Figure 14D:
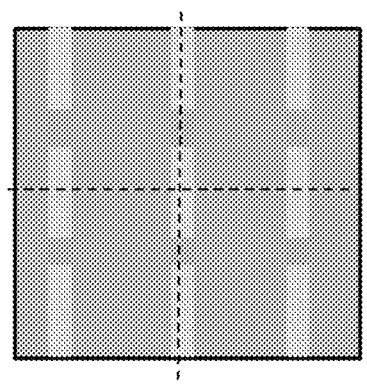

FIG. 14(c) is an example of the secondary electron image (first image P1) by the secondary electron detector 9 and includes images with the surface patterns 201a to 201b and 202a to 202b. FIG. 14(d) is an example of the backscattered electron image (second image P2) by the backscattered electron detector 10 and includes images of the lower layer patterns 203a to 203c, 204a to 204c, and 205a to 205c. The image of FIG. 14(d) is a backscattered electron image, and thus the contrast of the image is lower than the contrast of the image of FIG. 14(c).

A procedure for calculating the amount of misalignment of the X-direction center-of-gravity position of an overlay misalignment measurement pattern will be described in detail with reference to FIG. 15. Scanning areas 211a to 211d illustrated in FIG. 15(a) are areas set in the recipe so that the amount of misalignment of the X-direction center-of-gravity positions of the upper and lower layer patterns is measured. In the second embodiment, the scanning areas 211a to 211d are scanned not in one direction but in both directions (left-to-right and right-to-left) (arrows 212a to 212d and 213a to 213d in FIG. 15(b)). As an example, scanning is performed in the order of the arrow 212a, the arrow 213a, the arrow 212b, the arrow 213b, the arrow 212c, and the arrows 213c, 212d, and 213d. In a case where 2 or more is set as a frame count, the scanning from the arrow 212a to the arrow 213d is repeated by the set frame count. Adding the signals in different scanning directions here is to cancel the offset of the overlay measurement value generated depending on the scanning direction.

Figure 15C:
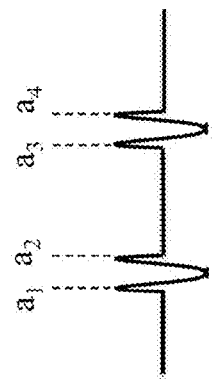
FIGS. 15A to 15D are schematic diagrams illustrating a procedure for calculating the X-direction center-of-gravity position of the overlay measurement pattern in the overlay misalignment measurement in the second embodiment.

FIG. 15(c) is an example of a line profile obtained by adding a secondary electron signal obtained by scanning. The signal obtained by the right-to-left scanning (213a to 213d) is added after being inverted so as to match the signal obtained by the left-to-right scanning (212a to 212d) A line profile is generated in the image processing unit 19 by this addition signal. In the line profile, the peak positions ($a_1$ to aa) corresponding to the upper layer patterns 201a to 201d are detected. Here, the X-direction center-of-gravity position $a_{X1}$ of the left-column patterns (201a and 202a) and the X-direction center-of-gravity position $a_{X2}$ of the right-column patterns (201b and 202b) are given by the following equations.

$$a_{X1}=(a_1+a_2)/2 \quad \text{(Equation 21)}$$

$$a_{X2}=(a_3+a_4)/2 \quad \text{(Equation 22)}$$

In addition, the X-direction center-of-gravity position $a_X$ of the four upper layer patterns is given by the following equation.

$$a_X=(a_{X1}+a_{X2})/2 \quad \text{(Equation 23)}$$

Figure 15D:
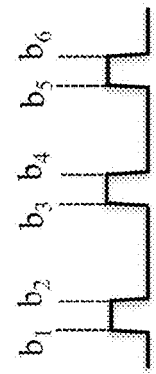
Figure 15A:
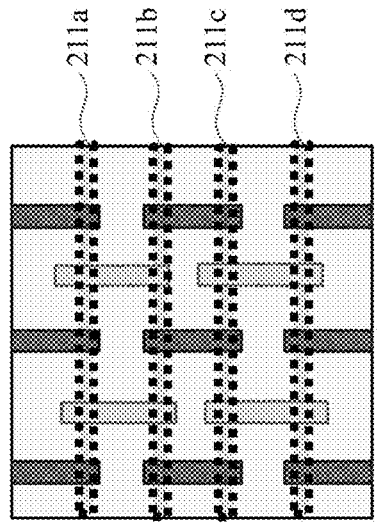
Figure 15B:
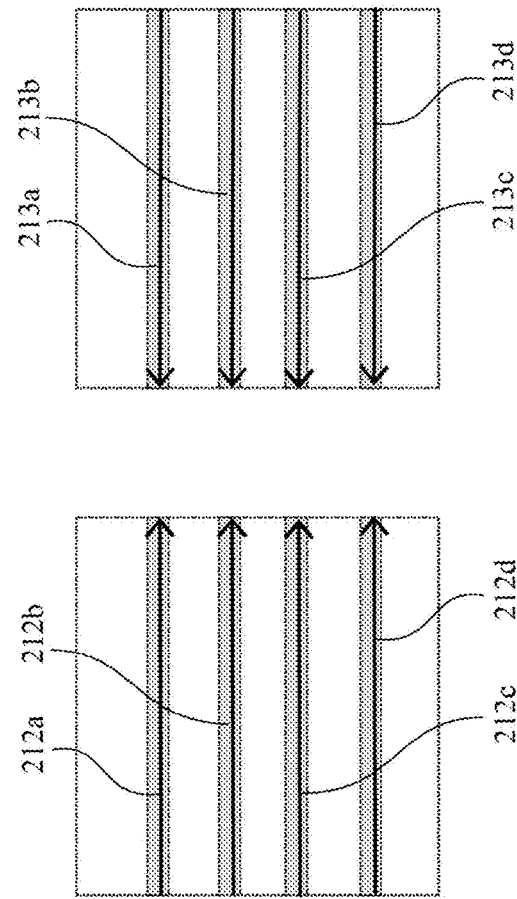

In addition, FIG. 15(d) is an example of a line profile obtained by adding a backscattered electron signal obtained by scanning. The signal obtained by the right-to-left scanning (213a to 213d) is added after being inverted so as to match the signal obtained by the left-to-right scanning (212a to 212d). A line profile is generated in the image processing unit 19 by this addition signal. In the line profile, the edge positions ($b_1$ to $b_E$) corresponding to the lower layer patterns are detected. Here, the X-direction center-of-gravity position $b_{X1}$ of the left-column patterns (203a, 204a, and 205a), the X-direction center-of-gravity position $b_{X2}$ of the middle-column patterns (203b, 204b, and 205b), and an X-direction center-of-gravity position $b_{X3}$ of the right-column patterns (203c, 204c, and 205c) are given by the following equations.

$$b_{X1}=(b_1+b_2)/2 \quad \text{(Equation 24)}$$

$$b_{X2}=(b_3+b_4)/2 \quad \text{(Equation 25)}$$

$$b_{X3}=(b_5+b_6)/2 \quad \text{(Equation 26)}$$

In addition, the X-direction center-of-gravity position $b_X$ of the nine lower layer patterns is given by the following equation.

$$b_X=(b_{X1}+b_{X2}+b_{X3})/3 \quad \text{(Equation 27)}$$

Here, an X-direction overlay misalignment Δx is obtained by the following equation.

$$\Delta x=b_X-a_X \quad \text{(Equation 28)}$$

A method for registering the scanning areas 211a to 211d in the present second example in the second embodiment will be described with reference to FIG. 16. Information on the scanning areas 211a to 211d may be stored in the measurement (X direction) tab 125 and the measurement (Y direction) tab 126 of the recipe condition display area 114. Hereinafter, registration of the scanning area for X-direction misalignment measurement will be described.

The installation operation of scanning areas 222a to 222d is executed with a template image registered and displayed in the image display area 113. In a scanning area registration unit 221, the scanning areas 222a to 222d are registered by inputting scanning conditions of the scanning areas 222a to 222d (e.g. scanning direction, scanning line count, and addition frame count) via a scanning direction input unit 222a, a scanning region area input unit 222b, a scanning line count input unit 222c, and an addition frame count input unit 222d. Here, the scanning direction input unit 222a is capable of selecting any of the left-to-right direction (X-normal), the right-to-left direction (X-reverse), and both directions (X-both) as the scanning direction. In this embodiment, the offset of the measured value of the amount of overlay misalignment depending on the scanning direction is canceled by selecting X-both. Alternatively, the average value of the measured value in X-normal and the measured value in X-reverse may be calculated.

Next, with a scanning area selection mode selected using a scanning area selection button 222a, scanning area setting is performed by adjusting the position of the area displayed in the image display area 113 in accordance with the input values of the input units 222b to 222d. By clicking a scan button 222e after the setting, the scanning areas 211a to 211d are scanned in accordance with the set scan conditions and the obtained secondary and backscattered electron signal profiles are displayed on the secondary electron signal display unit 133 and the backscattered electron signal display unit 134 of the line profile display area 130 in the measurement (X direction) tab 125, respectively.

In this state, a procedure for registering a measurement position in the line profile is executed as in the first embodiment. As illustrated in FIG. 16, the pattern position measurement condition setting area 131 is displayed on the right side of the line profile display area 130.

In the pattern position measurement condition setting area 131, input to the CH setting area 135a and the measurement point count setting area 135b is performed with regard to the upper layer (Layer-1), and then the setting button 135c is clicked. As a result, measurement cursors 223a and 223b are displayed in the secondary electron signal display unit 133. The widths and positions of the measurement cursors 223a and 223b are adjusted by mouse operation such that the measurement cursor 223a includes the pattern on the left side of the line profile of the secondary electron signal and the measurement cursor 223b includes the pattern on the right side. Subsequently, the registration button 135d is clicked and the measurement area of Layer-1 is confirmed. In some cases, measurement area re-registration is performed after the current registration area is deleted using the deletion button 135e.

Likewise, in the pattern position measurement condition setting area 131, input to the CH setting area 136a and the measurement point count setting area 136b is performed with regard to the lower layer (Layer-2), and then the setting button 136c is clicked. As a result, measurement cursors (224a, 224b, and 224c) are displayed in the backscattered electron signal display unit 134. The widths and positions of the measurement cursors are adjusted by mouse operation such that the measurement cursor 224a includes the left-column pattern, the measurement cursor 224b includes the middle-column pattern, and the measurement cursor 224c includes the right-column pattern, respectively. Subsequently, the setting button 136d is clicked and the measurement area of Layer-2 is confirmed. In some cases, measurement area re-registration is performed after the current registration area is deleted using the deletion button 136e.

With the line profile acquired and various measurement conditions in the line profile set in this manner, overlay misalignment measurement is executed under the conditions set as described above by clicking the measurement button 141a in the overlay misalignment measurement area 132. In the line profile display area 130 at this time, a center-of-gravity position 225 of the upper layer pattern and a center-of-gravity position 226 of the lower layer pattern are displayed together with the line profile. Further, the measured overlay misalignment is displayed in the measurement result display area 141b. If the measurement result is unproblematic, the OK button 141c is clicked to confirm measurement condition.

As described above, according to this second embodiment, effects equivalent to those of the first embodiment can be obtained. In addition, according to this second embodiment, it is possible to perform bidirectional pattern scanning with respect to a scanning area and generate a bidirectional signal-added line profile.

According to this, it is possible to generate a line profile by canceling the difference in responsiveness between detectors and an offset attributable to charging and it is possible to measure the amount of overlay misalignment with greater accuracy.

It should be noted that the present invention is not limited to the embodiments described above and includes various modification examples. For example, the embodiments have been described in detail so that the present invention is described in an easy-to-understand manner and the embodiments are not necessarily limited to those including the described configurations without exception. In addition, it is possible to replace a part of the configuration of one embodiment with the configuration of another embodiment and it is possible to add the configuration of one embodiment to the configuration of another embodiment. In addition, another configuration may be added to a part of the configuration of each embodiment, the latter may lack the former, or the former may replace the latter. In addition, each of the above configurations, functions, processing units, processing means, and so on may be implemented by hardware by, for example, being designed using an integrated circuit in part or in whole.

REFERENCE SIGNS LIST

1: column
2: sample chamber
3: electron gun
4: condenser lens
5: aligner
6: ExB filter
7: deflector
8: objective lens
9: secondary electron detector
10: backscattered electron detector
11: wafer
12: standard sample
13: XY stage
14: optical microscope
15, 16: amplifier
17: electron optical system controller
18: stage controller
19: image processing unit
20: control unit
100: computer system

The invention claimed is:

1. A charged particle beam system comprising:
a charged particle beam irradiation unit irradiating a sample with a charged particle beam;
a detector detecting a secondary electron signal or a backscattered electron signal from the sample; and
a computer system controlling the charged particle beam irradiation unit and measuring the amount of overlay misalignment in the sample, wherein
the computer system includes
an image generation unit generating an image based on a signal of the detector,
a matching processing unit specifying a position of an overlay measurement pattern by matching processing in relation to a template image in the image generated by the image generation unit,
a line profile generation unit generating a first line profile regarding the secondary electron signal and generating a second line profile regarding the backscattered electron signal by selectively scanning a portion of the overlay measurement pattern at the position specified by the matching processing unit, and
an overlay misalignment measurement unit specifying a position of a first pattern in the overlay measurement pattern from the first line profile, specifying a position of a second pattern in the overlay measurement pattern from the second line profile, and measuring the overlay misalignment in the sample based on the position of the first pattern and the position of the second pattern.

2. The charged particle beam system according to claim 1, wherein the line profile generation unit corrects a position where the scanning is executed based on the position of the overlay measurement pattern specified by the matching processing unit.

3. The charged particle beam system according to claim 1, comprising a display unit displaying the image generated by the image generation unit and the first line profile or the second line profile.

4. The charged particle beam system according to claim 1, wherein the line profile generation unit is configured to be capable of designating a scanning area for line profile generation on the image generated by the image generation unit.

5. The charged particle beam system according to claim 4, wherein the line profile generation unit is configured to be capable of designating a first scanning area where a first direction is a longitudinal direction and a second scanning area where a second direction intersecting with the first direction is a longitudinal direction.

6. The charged particle beam system according to claim 1, wherein a measurement cursor or a line template image corresponding to the first line profile or the second line profile are pre-registered, and wherein the overlay misalignment measurement unit adjusts a position of the measurement cursor based on a result of matching processing between the line template image and the first line profile or the second line profile.

7. The charged particle beam system according to claim 1, wherein the line profile generation unit generates the first line profile or the second line profile by adding a signal obtained by charged particle beam scanning along different directions.

8. An overlay misalignment measurement method for measuring the amount of overlay misalignment between different layers of a sample based on a signal detected by a detector by irradiating the sample with a charged particle beam, the method comprising:
- a step of generating an image based on output of the detector;
- a step of specifying a position of an overlay measurement pattern by matching processing between the image and a template image;
- a step of generating a first line profile regarding a secondary electron signal and generating a second line profile regarding a backscattered electron signal by selectively scanning a portion of the overlay measurement pattern at the position of the overlay measurement pattern;
- a step of specifying a position of a first pattern in the overlay measurement pattern from the first line profile and specifying a position of a second pattern in the overlay measurement pattern from the second line profile; and
- a step of measuring the overlay misalignment in the sample based on the position of the first pattern and the position of the second pattern.

9. The overlay misalignment measurement method according to claim 8, wherein a position where the scanning is executed is corrected based on the position of the overlay measurement pattern specified by the matching processing in a case where the first line profile or the second line profile is generated.

10. The overlay misalignment measurement method according to claim 8, further comprising a step of designating a scanning area in a case where the first line profile or the second line profile is generated.

11. The overlay misalignment measurement method according to claim 10, wherein the scanning area includes a first scanning area where a first direction is a longitudinal direction and a second scanning area where a second direction intersecting with the first direction is a longitudinal direction.

12. The overlay misalignment measurement method according to claim 8, wherein a measurement cursor or a line template image corresponding to the first line profile or the second line profile are pre-registered, further comprising a step of adjusting a position of the measurement cursor based on a result of matching processing between the line template image and the first line profile or the second line profile.

13. The overlay misalignment measurement method according to claim 8, wherein the first line profile or the second line profile is generated by adding a signal obtained by charged particle beam scanning along different directions in a case where the first line profile or the second line profile is generated.

\* \* \* \* \*